United States Patent
An et al.

(10) Patent No.: US 12,062,665 B2
(45) Date of Patent: Aug. 13, 2024

(54) DISPLAY DEVICE

(71) Applicant: Samsung Display Co., Ltd., Yongin-si (KR)

(72) Inventors: Jin Sung An, Seongnam-si (KR); Seok Je Seong, Seongnam-si (KR); Seong Jun Lee, Seoul (KR); Ji Seon Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/239,470

(22) Filed: Aug. 29, 2023

(65) Prior Publication Data

US 2023/0411404 A1    Dec. 21, 2023

Related U.S. Application Data

(63) Continuation of application No. 18/100,170, filed on Jan. 23, 2023, now Pat. No. 11,798,956, which is a
(Continued)

(30) Foreign Application Priority Data

Mar. 6, 2020    (KR) .................. 10-2020-0028653

(51) Int. Cl.
*H01L 27/12*        (2006.01)
*G09G 3/3291*    (2016.01)
*H10K 59/131*    (2023.01)

(52) U.S. Cl.
CPC ......... *H01L 27/124* (2013.01); *G09G 3/3291* (2013.01); *G09G 2300/0426* (2013.01); *H10K 59/131* (2023.02)

(58) Field of Classification Search
None
See application file for complete search history.

(56) References Cited

U.S. PATENT DOCUMENTS

| 8,711,138 B2 | 4/2014 | Kawabe |
| 11,289,556 B2 * | 3/2022 | Bae .................... H01L 27/1222 |
| 2015/0206982 A1 | 7/2015 | Moon et al. |

FOREIGN PATENT DOCUMENTS

| EP | 3392909 A1 | 10/2018 |
| EP | 3477705 A1 | 5/2019 |

OTHER PUBLICATIONS

Extended European Search Report for Application No. 21155911.7 dated Aug. 5, 2021.

* cited by examiner

*Primary Examiner* — Nicholas J Lee
(74) *Attorney, Agent, or Firm* — CANTOR COLBURN LLP

(57) ABSTRACT

A display device includes a first active pattern, a first conductive pattern including a gate electrode overlapping the first active pattern, a first gate line overlapping the first active pattern and extending in a first direction, and a second gate line extending in the first direction, a second conductive pattern disposed on the first conductive pattern and including a third gate line extending in the first direction and a fourth gate line extending in the first direction, a second active pattern disposed on the second conductive pattern and including a material different from a material of the first active pattern, and a third conductive pattern disposed on the second active pattern and including a first upper electrode overlapping the third gate line and connected to the third gate line, and a second upper electrode overlapping the fourth gate line and connected to the fourth gate line.

20 Claims, 18 Drawing Sheets

Related U.S. Application Data continuation of application No. 17/144,273, filed on Jan. 8, 2021, now Pat. No. 11,594,558.

DISPLAY DEVICE

This application is a continuation of U.S. patent application Ser. No. 18/100,170, filed on Jan. 23, 2023, which is a continuation of U.S. patent application Ser. No. 17/144,273, filed on Jan. 8, 2021, which claims priority to Korean Patent Application No. 10-2020-0028653, filed on Mar. 6, 2020, and all the benefits accruing therefrom under 35 U.S.C. § 119, the content of which in its entirety is herein incorporated by reference.

BACKGROUND

1. Field

Embodiments are directed to a display device. More particularly, embodiments are directed to a display device having a reduced bezel area.

2. Description of the Related Art

A display device may be applied to a smartphone, tablet personal computer ("PC"), laptop, monitor, television ("TV"), and the like. Many studies are being conducted to reduce a size and a weight of the display device. In order to reduce the size and the weight of the display device, a display area needs to be enlarged, and a non-display area (e.g., bezel area) needs to be reduced. When connection lines included in the display device are bypassed through the display area, the non-display area may be reduced.

SUMMARY

Embodiments provide a display device having a reduced non-display area.

In an embodiment, a display device may include a first active pattern, a first conductive pattern including a gate electrode overlapping the first active pattern, a first gate line overlapping the first active pattern and extending in a first direction, and a second gate line extending in the first direction, a second conductive pattern disposed on the first conductive pattern and including a third gate line extending in the first direction and a fourth gate line extending in the first direction, a second active pattern disposed on the second conductive pattern and including a material different from a material of the first active pattern and a third conductive pattern disposed on the second active pattern and including a first upper electrode overlapping the third gate line and electrically connected to the third gate line, and a second upper electrode overlapping the fourth gate line and electrically connected to the fourth gate line.

In an embodiment, the display device may further include a fourth conductive pattern disposed on the third conductive pattern, and including a horizontal connection line extending in the first direction and applied with a first data voltage.

In an embodiment, the display device may further include a fifth conductive pattern disposed on the fourth conductive pattern, and including a data line extending in a second direction intersecting the first direction and applied with the second data voltage, a vertical connection line extending in the second direction and applied with the first data voltage and a high power voltage line extending in the second direction and applied with the high power voltage.

In an embodiment, the fourth conductive pattern may further include a data voltage pad, and the data line may overlap the data voltage pad and may be electrically connected to the data voltage pad.

In an embodiment, the vertical connection line may overlap the horizontal connection line and is electrically connected to the horizontal connection line.

In an embodiment, the fourth conductive pattern may further include a shielding pattern, and the high power voltage line may overlap the shielding pattern and is electrically connected to the shielding pattern.

In an embodiment, a first gate signal may be applied to the first gate line, a second gate signal may applied to the third gate line, and a third gate signal may be applied to the fourth gate line.

In an embodiment, a light emitting control signal may be applied to the second gate line.

In an embodiment, the second conductive pattern may further include a gate initialization voltage line.

In an embodiment, the display device further includes a fourth conductive pattern disposed on the third conductive pattern and the fourth conductive pattern may further include a gate initialization voltage connection pattern.

In an embodiment, the gate initialization voltage connection pattern may overlap the gate initialization voltage line and be electrically connected to the gate initialization voltage line.

In an embodiment, the gate initialization voltage connection pattern may overlap the second active pattern and be electrically connected to the second active pattern.

In an embodiment, the first active pattern may include a silicon semiconductor, and the second active pattern may include an oxide semiconductor.

In an embodiment, a portion of the first gate line and a portion of the first active pattern, which overlap each other, may constitute an n-channel metal-oxide-semiconductor ("NMOS") transistor.

In an embodiment, a portion of the second gate line and a portion of the first active pattern, which overlap each other, may constitute an NMOS transistor.

In an embodiment, a portion of the gate electrode and a portion of the first active pattern, which overlap each other, may constitute an NMOS transistor.

In an embodiment, a portion of the first upper electrode and a portion of the second active pattern, which overlap each other, may constitute a p-channel metal-oxide-semiconductor ("PMOS") transistor.

In an embodiment, a portion of the second upper electrode and a portion of the second active pattern, which overlap each other may constitute a PMOS transistor.

The display device in an embodiment may include a first active pattern, a first conductive pattern including a gate electrode overlapping the first active pattern, a first gate line overlapping the first active pattern and extending in a first direction, and a second gate line extending in the first direction, a second conductive pattern disposed on the first conductive pattern and including a third gate line extending in the first direction and a fourth gate line extending in the first direction, a second active pattern disposed on the second conductive pattern and including a material different from the first active pattern and a third conductive pattern disposed on the second active pattern and including a first upper electrode overlapping the third gate line and electrically connected to the third gate line, and a second upper electrode overlapping the fourth gate line and electrically connected to the fourth gate line.

Therefore, the display device may bypass and transmit a gate signal through a contact hole electrically connecting the third gate line and the upper electrode and a contact hole connecting the fourth gate line and the second upper electrode. Accordingly, a space in which extra line, patterns, and the like may be additionally arranged in the third conductive pattern. Therefore, as the fourth conductive pattern and the fifth conductive pattern may transmit the data voltage to the display area without adding a separate conductive pattern, fan-out lines used in the prior art are removed, so that a non-display area of the display device may be reduced. Through this, it is possible to reduce the size and weight of the display device.

It is to be understood that both the foregoing general description and the following detailed description are exemplary and explanatory and are intended to provide further explanation of the invention as claimed.

BRIEF DESCRIPTION OF THE DRAWINGS

Features, advantages and embodiments of the invention will be more clearly understood from the following detailed description taken in conjunction with the accompanying drawings.

DETAILED DESCRIPTION

Figure 1:
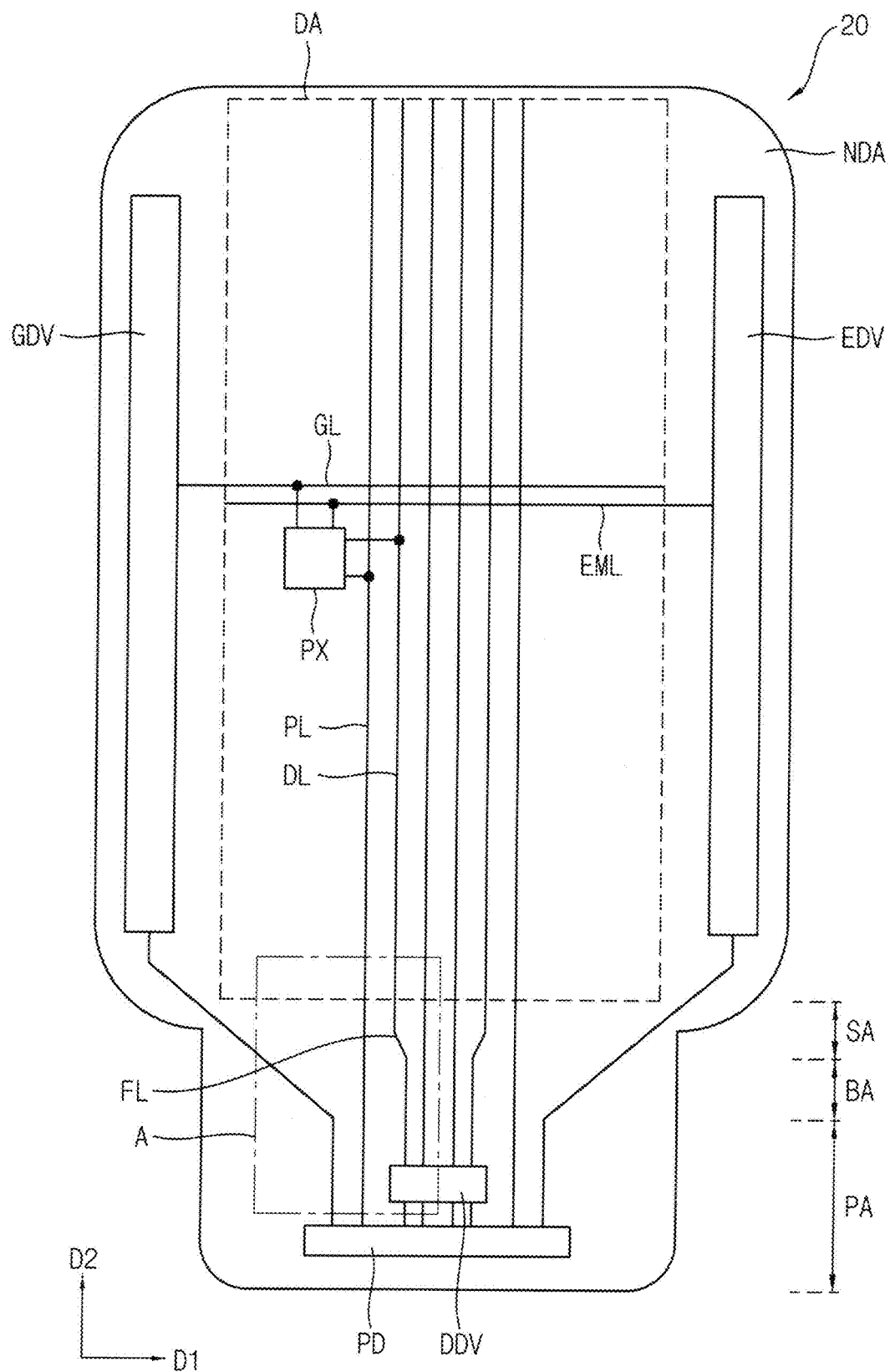
FIG. 1 is a plan view illustrating an embodiment of a display device according to the invention.

Embodiments of a display device of the invention will be described hereinafter with reference to the accompanying drawings, in which embodiments are shown. Same or similar reference numerals may be used for same or similar elements in the drawings.

Embodiments of the invention may have various modifications and may be embodied in different forms, and embodiments will be explained in detail with reference to the accompany drawings. Embodiments of the invention may, however, be embodied in different forms and should not be construed as limited to the embodiments set forth herein. Rather, all modifications, equivalents, and substituents which are included in the spirit and technical scope of the invention should be included.

In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or".

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be further understood that the terms "comprises," "comprising," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

It will also be understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. When an element is referred to as being disposed "on" another element, it can be disposed under the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
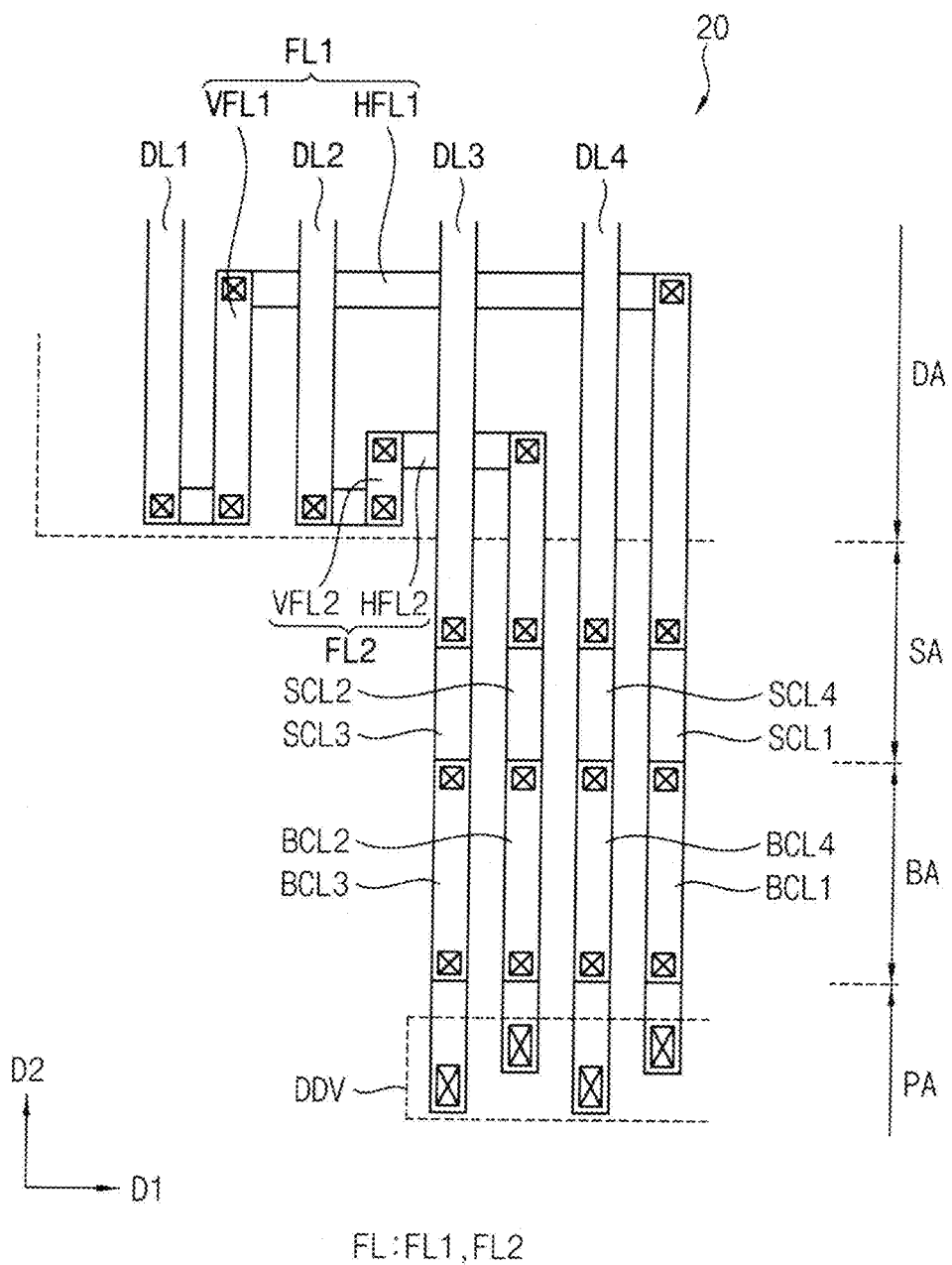
FIG. 2 is an enlarged view illustrating lines included in the display device of FIG. 1.
Figure 3:
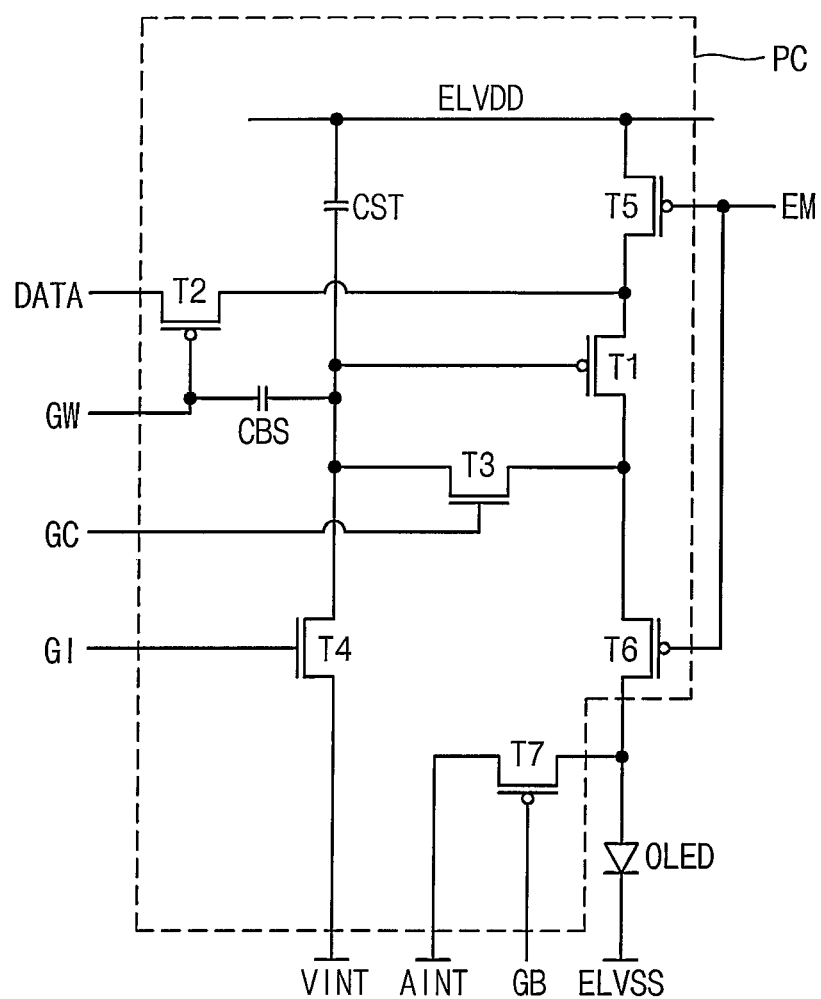
FIG. 3 is a circuit view illustrating an example of a pixel circuit included in the display device of FIG. 1.

FIG. 1 is a plan view illustrating an embodiment of a display device according to the invention, FIG. 2 is an enlarged view illustrating lines included in the display device of FIG. 1, and FIG. 3 is a circuit view illustrating an example of a pixel circuit included in the display device of FIG. 1.

Referring to FIGS. 1 to 3, a display device 20 may include a display area DA, a non-display area NDA surrounding the display area DA, a bending area BA that may be bent, a peripheral area SA between the display area DA and the bending area BA, and a pad area PA.

In an embodiment, a pixel structure PX may be disposed in the display area DA, and a driver for driving the pixel structure PX may be disposed in the non-display area NDA, for example. In an embodiment, a pad part PD and a data driver DDV may be disposed in the pad area PA, and the bending area BA may be bent based on a virtual bending axis, for example. In an embodiment, since the pixel structure PX is not disposed in the peripheral area SA, a width extending in a second direction D2 of the peripheral area SA may be defined as a dead space of the display device 20, for example.

The pixel structure PX may be disposed in the display area DA. In addition, a data line DL, a gate line GL, a light emitting control line EML, a driving voltage line PL, and a connection line FL connected to the pixel structure PX may be disposed in the display area DA.

The connection line FL may be electrically connected to the data driver DDV and the data line DL. The connection line FL may receive the data voltage DATA from the data driver DDV and provide the data voltage DATA to the data line DL.

The driving unit may include a gate driver GDV, the data driver DDV, a light emitting driver EDV, and the pad part PD. In addition, the driver may include a timing controller, and the timing controller may control the gate driver GDV, the data driver DDV, and the light emitting driver EDV.

In an embodiment, as illustrated in FIGS. 1 and 2, the data line DL and the connection line FL may be disposed in the display area DA. In an embodiment, first to fourth data lines DL1, DL2, DL3, and DL4, a first connection line FL1, and a second connection line FL2 may be disposed in the display area DA, for example. In an embodiment, the connection line FL may be a fan-out line electrically connecting the data driver DDV and the data line DL, for example.

In an embodiment, the pixel structure PX may include first to fourth pixel structures disposed along a first direction D1 intersecting the second direction D2. In an embodiment, the second direction D2 may be perpendicular to the first direction D1. The first data line DL1 may be connected to the first pixel structure, the second data line DL2 may be connected to the second pixel structure, the third data line DL3 may be connected to the third pixel structure, and the fourth data line DL4 may be connected to the fourth pixel structure.

In an embodiment, the first connection line FL1 may include a first vertical connection line VFL1 and a first horizontal connection line HFL1, the second connection line FL2 may include a second vertical connection line VFL2 and a second horizontal connection line HFL2. In an embodiment, the first and second vertical connection lines VFL1 and VFL2 may extend in the second direction D2, and the first and second horizontal connection lines HFL1 and HFL2 may extend in the first direction D1, for example.

The first connection line FL1 may electrically connect the data driver DDV and the first data line DL1. In an embodiment, the first data voltage may be provided to the first pixel structure through the first connection line FL1 and the first data line DL1, for example.

In an embodiment, the first vertical connection line VFL1 may be connected to a first input transfer line SCL1, the first input transfer line SCL1 may be connected to a first bending transfer line BCL1, and the first bending transfer line BCL1 may be connected to the first output transfer line DCL1.

Figure 6:
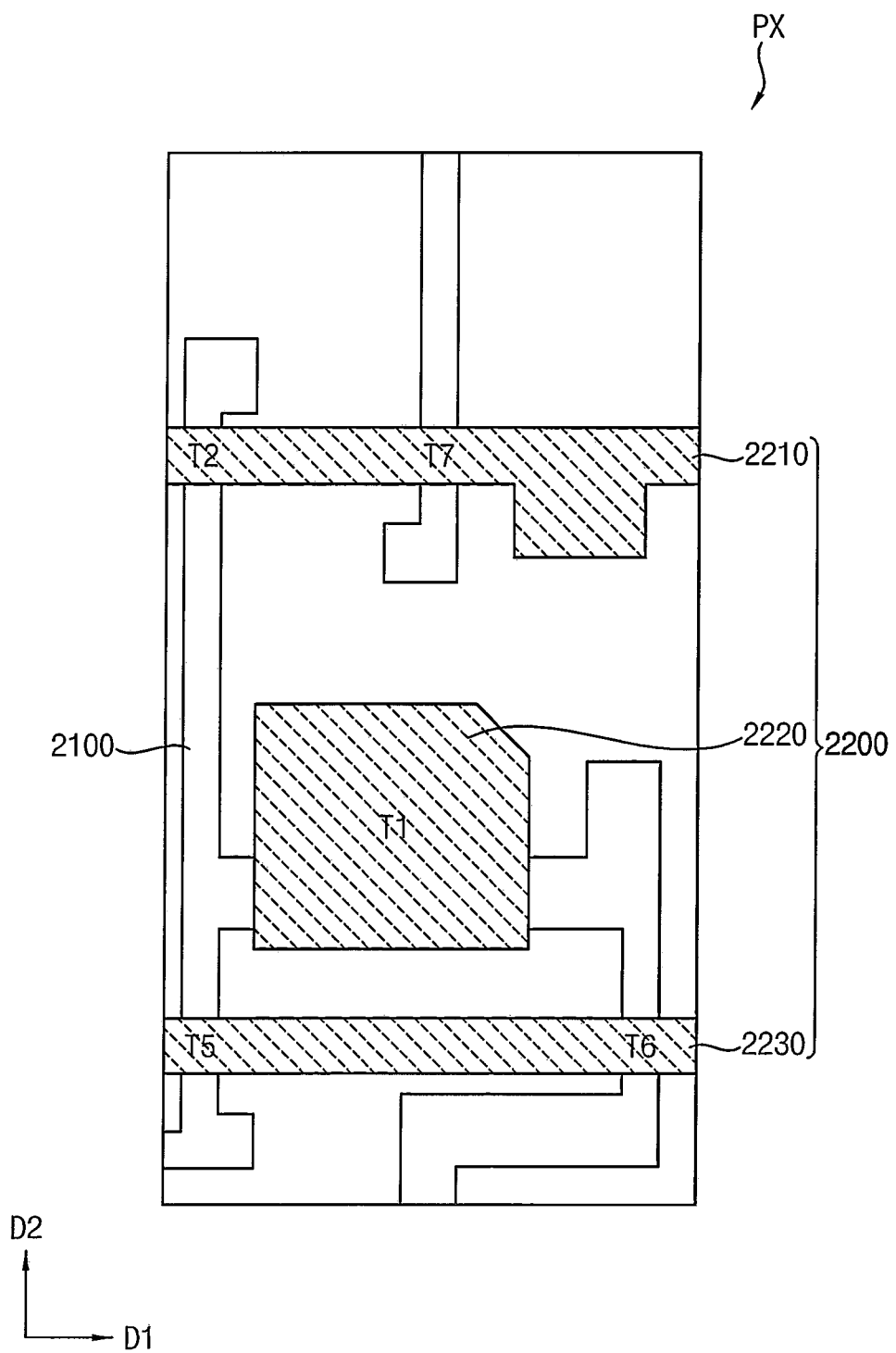
Figure 15:
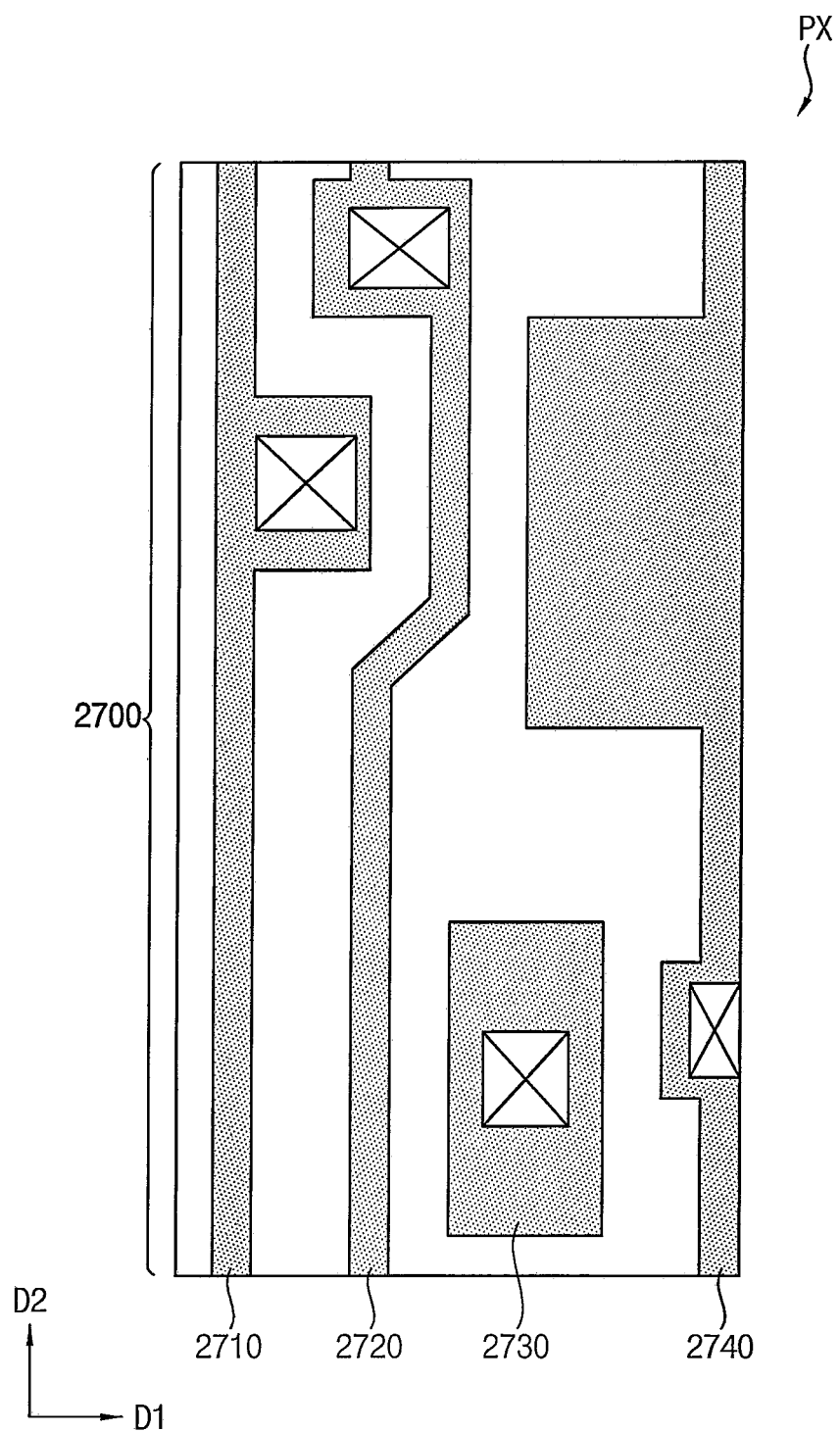
Figure 16:
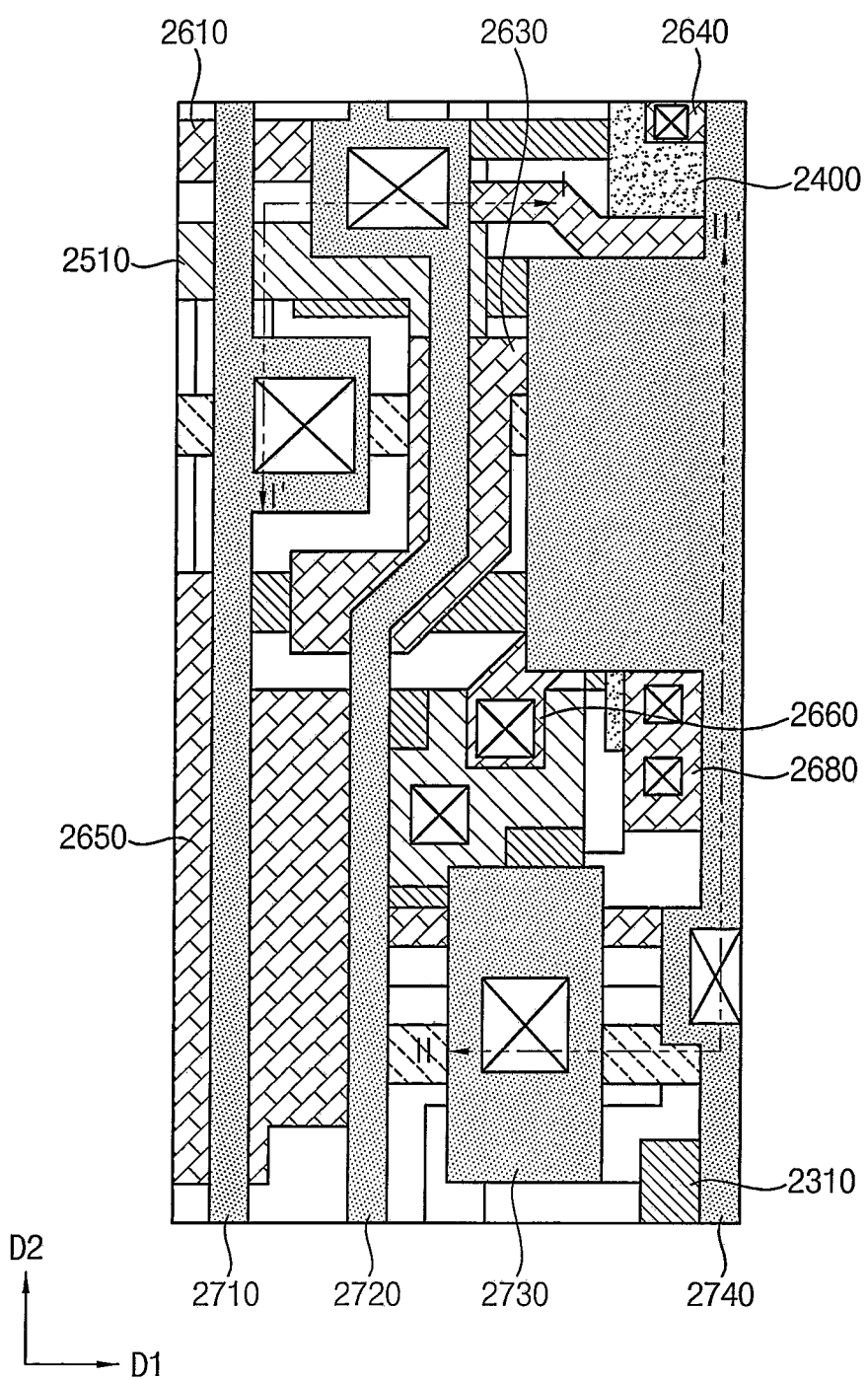

In an embodiment, the first vertical connection line VFL1 may extend from the peripheral area SA to the display area DA, and may be disposed on a first layer (e.g., a layer on which a fifth conductive pattern 2700 of FIGS. 15 and 16 is disposed), for example. The first input transfer line is disposed in the peripheral area SA, and may be disposed on a second layer (e.g., a layer on which a first conductive pattern 2200 of FIG. 6 is disposed) disposed below the first layer. The first bending transfer line may be disposed in the bending area BA and may be disposed in the first layer. The first output transfer line DCL1 may be disposed in the pad area PA and may receive the first data voltage from the data driver DDV.

The second connection line FL2 may electrically connect the data driver DDV and the second data line DL2. In an embodiment, the second data voltage may be provided to the second pixel structure through the second connection line FL2 and the second data line DL2, for example.

In an embodiment, the second vertical connection line VFL2 may be connected to a second input transfer line SCL2, the second input transfer line SCL2 may be connected to a second bending transfer line BCL2, and the second bending transfer line BCL2 may be connected to a second output transfer line DCL2. However, since the structures of the second vertical connection line VFL2, the second input transfer line SCL2, the second bending transfer line BCL2, and the second output transfer line DCL2 are substantially the same as the structures of the first vertical connection line VFL1, the first input transfer line SCL1, the first bending transfer line BCL1, and the first output transfer line DCL1, a detailed description will be omitted.

The third data line DL3 may be connected to the data driver DDV. In an embodiment, the third data voltage may be provided to the third pixel structure through the third data line DL3, for example.

In an embodiment, the third data line DL3 may be connected to a third input transfer line SCL3, the third input transfer line SCL3 may be connected to a third bending transfer line BCL3, and the third bending transfer line BCL3 may be connected to a third output transfer line DCL3.

Figure 7:
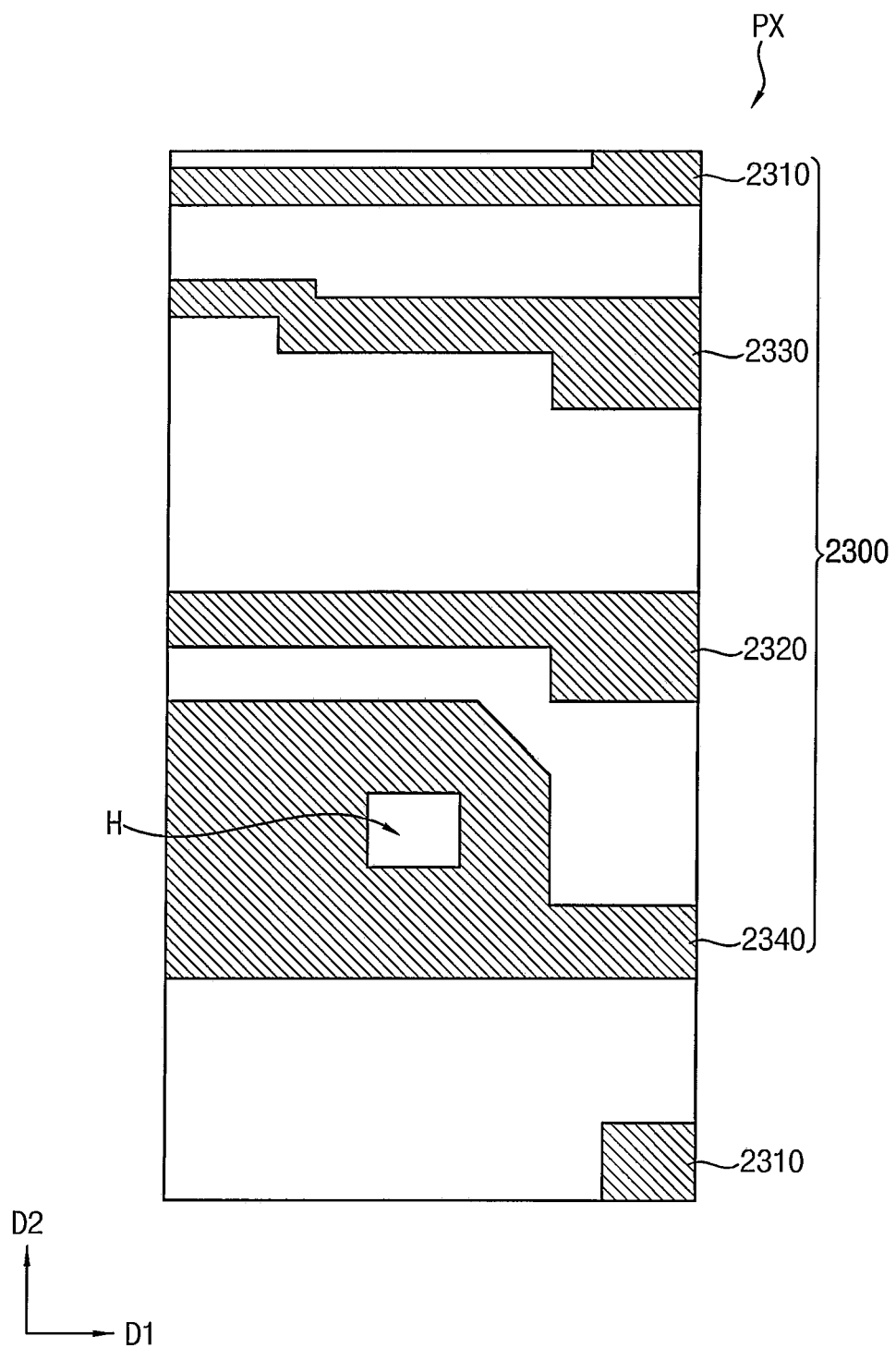

In an embodiment, the third data line DL3 may extend from the peripheral area SA to the display area DA, and may be disposed on the first layer, for example. The third input transfer line SCL3 may be disposed in the peripheral area SA, and may be disposed in a third layer disposed below the first layer (e.g., a layer on which a second conductive pattern 2300 of FIG. 7 is disposed). The third bending transfer line BCL3 may be disposed in the bending area BA and may be disposed in the first layer. The third output transfer line DCL3 may be disposed in the pad area PA and may receive the third data voltage from the data driver DDV.

The fourth data line DL4 may be connected to the data driver DDV. In an embodiment, the fourth data voltage may be provided to the fourth pixel structure through the fourth data line DL4, for example.

In an embodiment, the fourth data line DL4 may be connected to a fourth input transfer line SCL4, the fourth input transfer line SCL4 may be connected to a fourth bending transfer line BCL4, and the fourth bending transfer line BCL4 may be connected to a fourth output transfer line DCL4. However, since the structures of the fourth data line DL4, the fourth input transfer line SCL4, the fourth bending transfer line BCL4, and the fourth output transfer line DCL4 are substantially the same as those of the third data line DL3, the third input transfer line SCL3, the third bending transfer line BCL3 and the third output transfer line DCL3, detailed description will be omitted.

In an embodiment, the second layer may be disposed below the third layer. In an embodiment, the first and second transfer lines SCL1 and SCL2 may be disposed below the third and fourth transfer lines SCL3 and SCL4, for example. Accordingly, a space of the second layer of the peripheral area SA (or the third layer of the peripheral area SA) may be secured, and additional lines may be further disposed in the peripheral area SA. However, the invention is not limited thereto, and the connection structure and arrangement position of the above-described lines may be set as necessary.

As the connection line FL is disposed in the display area DA, The display device 20 of the invention may have a reduced width extending in the second direction D2 of the peripheral area SA compared to a conventional display device. In other words, a dead space of the display device 20 may be reduced.

A pixel circuit PC may include a first transistor T1, a second transistor T2, a third transistor T3, a fourth transistor T4, a fifth transistor T5, a sixth transistor T6, and a seventh transistor T7, a storage capacitor CST, and a boosting capacitor CBS. The pixel circuit PC is electrically connected to the organic light emitting diode OLED, and may provide a driving current to the organic light emitting diode OLED.

The organic light emitting diode OLED may include a first terminal (e.g., an anode terminal) and a second terminal (e.g., a cathode terminal). The first terminal of the organic light emitting diode OLED may be connected to the first transistor T1 via the sixth transistor T6 to receive the driving current, and the second terminal may be provided with a low power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain the voltage level of the gate terminal of the first transistor T1 during an inactive period of a first gate signal GW.

The boosting capacitor CBS may include a first terminal and a second terminal. The first terminal of the boosting capacitor CBS may be connected to the first terminal of the storage capacitor CST, and the second terminal of the boosting capacitor CBS may receive the first gate signal GW. The boosting capacitor CBS may compensate for the voltage drop of the gate terminal by increasing the voltage of the gate terminal of the first transistor T1 when the provision of the first gate signal GW is stopped.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may be connected to the organic light emitting diode OLED via the sixth transistor T6 to provide the driving current. The first transistor T1 may generate the driving current based on a voltage difference between the gate terminal and the first terminal. In an embodiment, the first transistor T1 may be also referred to as a driving transistor, for example.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. In an embodiment, when the second transistor T2 is a p-channel metal-oxide-semiconductor ("PMOS") transistor, the second transistor T2 is turned off when the first gate signal GW has a positive voltage level, and is turned on when the first gate signal GW has a negative voltage level, for example. The first terminal of the second transistor T2 may receive the data voltage DATA through the data line DL. The second terminal of the second transistor T2 may provide the data voltage DATA to the first terminal of the first transistor T1 while the second transistor T2 is turned on. In an embodiment, the second transistor T2 may be also referred to as a switching transistor, for example.

The third transistor T3 may include a gate terminal, a first terminal (e.g., a source terminal), and a second terminal (e.g., a drain terminal). The gate terminal of the third transistor T3 may receive a second gate signal GC. The first terminal of the third transistor T3 may be connected to the gate terminal of the first transistor T1. The second terminal of the third transistor T3 may be connected to a second terminal of the first transistor T1.

The third transistor T3 may be turned on or off in response to the second gate signal GC. In an embodiment, when the third transistor T3 is a n-channel metal-oxide-semiconductor ("NMOS") transistor, the third transistor T3 is turned on when the second gate signal GC has a positive voltage level, and is turned off when the second gate signal GC has a negative voltage level, for example.

During the period in which the third transistor T3 is turned on in response to the second gate signal GC, the third transistor T3 may diode-connect the first transistor T1. Since the first transistor T1 is diode-connected, a voltage difference equal to the threshold voltage of the first transistor T1 between the gate terminal of the first transistor T1 and the first terminal of the first transistor T1 may occur. Accordingly, at the gate terminal of the first transistor T1, a voltage summed by the voltage difference to the data voltage DATA provided to the first terminal of the first transistor T1 may be provided to the gate terminal of the first transistor T1 during the turn-on period of the third transistor T3 Accordingly, the third transistor T3 may compensate for the threshold voltage of the first transistor T1. In an embodiment, the third transistor T3 may be also referred to as a compensation transistor, for example.

The fourth transistor T4 may include a gate terminal, a first terminal (e.g., a source terminal), and a second terminal (e.g., a drain terminal). The gate terminal of the fourth transistor T4 may receive a third gate signal GI. The first terminal of the fourth transistor T4 may receive a gate initialization voltage VINT. The second terminal of the fourth transistor T4 may be connected to the gate terminal of the first transistor T1.

The fourth transistor T4 may be turned on or off in response to the third gate signal GI. In an embodiment, when the fourth transistor T4 is an NMOS transistor, the fourth transistor T4 is turned on when the third gate signal GI has a positive voltage level, and is turned off when the third gate signal GI has a negative voltage level, for example.

During a period in which the fourth transistor T4 is turned on by the third gate signal GI, the gate initialization voltage VINT may be provided to the gate terminal of the first transistor T1. Accordingly, the fourth transistor T4 may initialize the gate terminal of the first transistor T1 with the gate initialization voltage VINT. In an embodiment, the fourth transistor T4 may be also referred to as a gate initialization transistor, for example.

The fifth transistor T5 may include a gate terminal, a first terminal (e.g., a source terminal), and a second terminal (e.g., a drain terminal). The gate terminal of the fifth transistor T5 may receive an emitting control signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emitting control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emitting control signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emitting control signal EM, the sixth transistor T6 may transmit the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive a fourth gate signal GB. The first terminal of the seventh transistor T7 may receive an anode initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED with the anode initialization voltage AINT.

The connection structure of the pixel circuit PC illustrated in FIG. 3 is exemplary and may be variously changed. In an embodiment, the pixel circuit PC may not include the third to seventh transistors T3, T4, T5, T6, and T7 and the boosting capacitor CBS, for example. In this case, a connection structure between components in the pixel circuit PC may be changed to form a connection structure between components included in the pixel circuit PC (that is, the first and second transistors T1, T2, the storage capacitor CST, and the organic light emitting diode OLED).

FIGS. 4 to 16 are plan views for describing a pixel structure included in the display device of FIG. 1.

Figure 4:
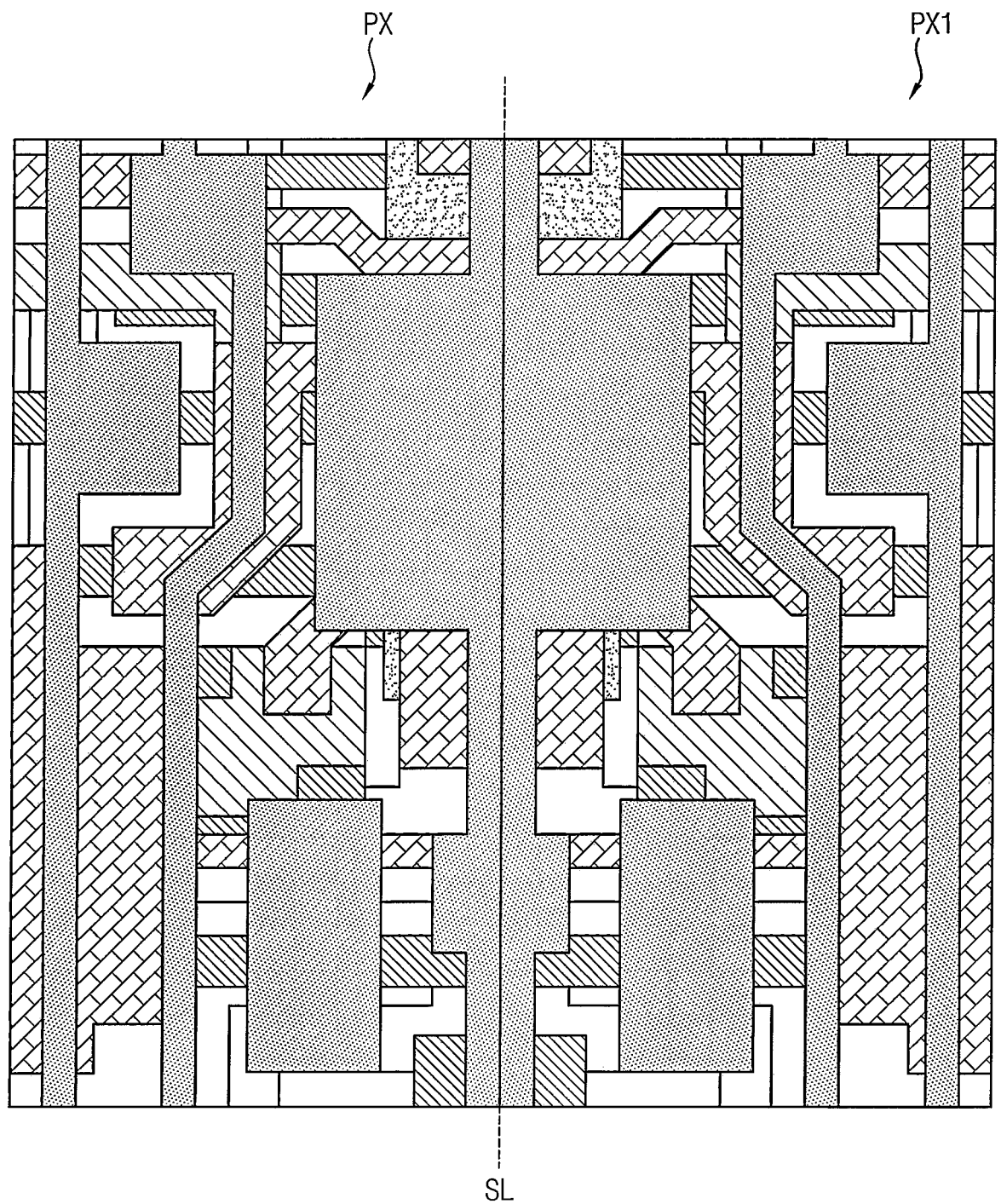
FIGS. 4 to 16 are plan views for describing a pixel structure included in the display device of FIG. 1.

Referring to FIG. 4, the display device 20 may include the pixel structure PX and a symmetric pixel structure PX1 adjacent to the pixel structure PX. In an embodiment, the structure of the symmetric pixel structure PX1 may be substantially the same as a structure in which the structure of the pixel structure PX is symmetrical with respect to an imaginary symmetric line SL, for example. Hereinafter, the pixel structure PX will be described for convenience of description.

Figure 5:
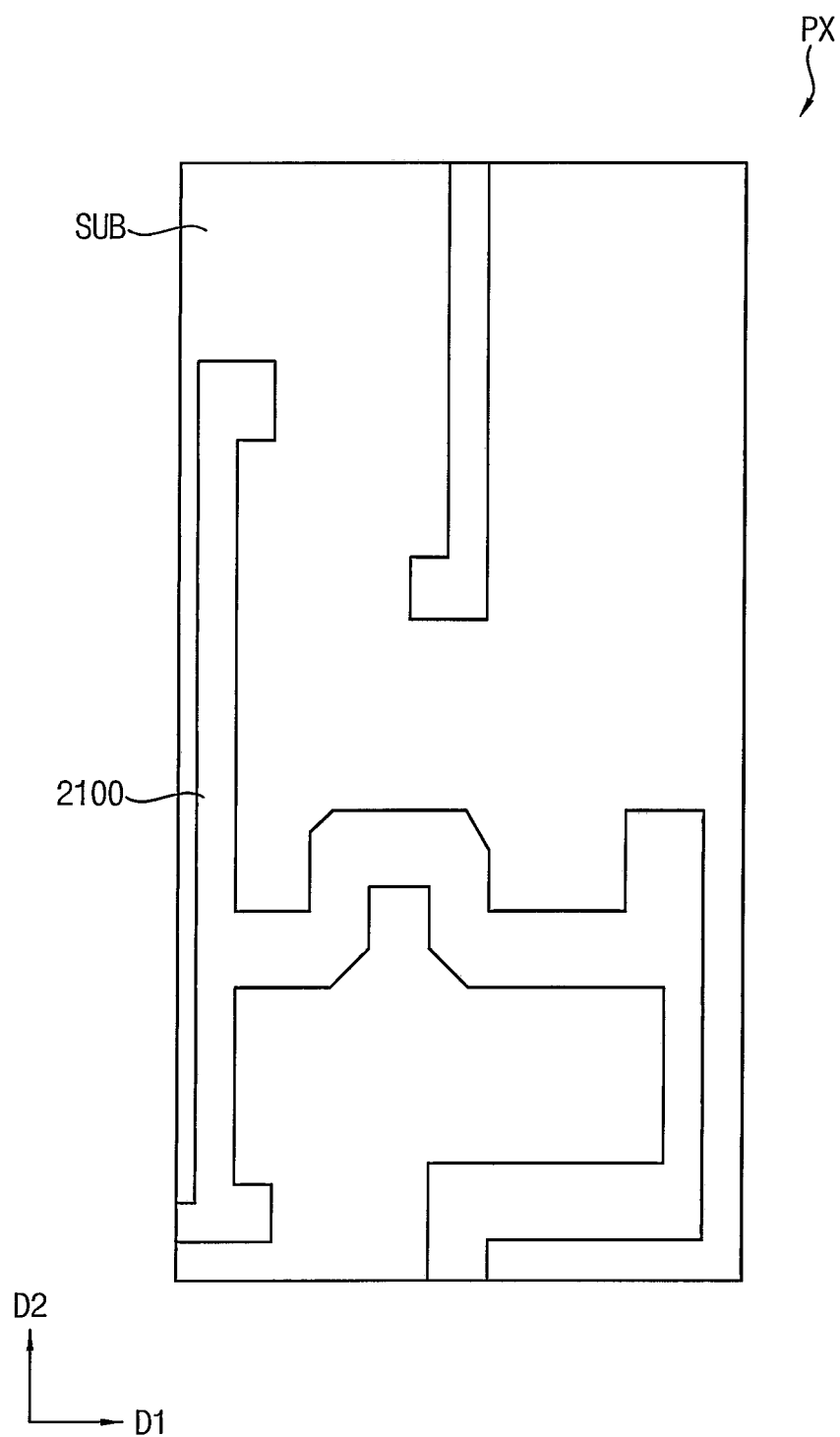

Referring to FIG. 5, the pixel structure PX may include a substrate SUB and a first active pattern 2100 disposed on the substrate SUB.

The substrate SUB may include a glass substrate, a quartz substrate, a plastic substrate, or the like. In an embodiment, the substrate SUB may include a plastic substrate, and thus the display device 20 may have a flexible characteristic. In this case, the substrate SUB may have a structure in which at least one organic film layer and at least one barrier layer are alternately stacked. In an embodiment, the organic film layer may be provided using an organic material such as polyimide, and the barrier layer may be provided using an inorganic material, for example.

A buffer layer (e.g., BUF of FIG. 17) may be disposed on the substrate SUB. The buffer layer may prevent diffusion of metal atoms or impurities from the substrate SUB into the first active pattern 2100. In addition, the buffer layer may uniformly form the first active pattern 2100 by controlling a heat supply rate during a crystallization process for forming the first active pattern 2100.

The first active pattern 2100 may be disposed on the buffer layer. In an embodiment, the first active pattern 2100 may include a silicon semiconductor. In an embodiment, the silicon semiconductor may include amorphous silicon, polycrystalline silicon, or the like, for example.

In an embodiment, ions may be selectively implanted into the first active pattern 2100. In an embodiment, when the first and second transistors T1 and T2 are the PMOS transistors, the first active pattern 2100 may include a source area and a drain area to which positive ions are injected, and a channel area to which the positive ions are not injected, for example.

A first gate insulating layer (e.g., GI1 in FIG. 17) may cover the first active pattern 2100 and may be disposed on the substrate SUB. The first gate insulating layer may include an insulating material. In an embodiment, the first gate insulating layer may include silicon oxide, silicon nitride, titanium oxide, tantalum oxide, or the like, for example.

Referring to FIG. 6, a first conductive pattern 2200 may be disposed on the first gate insulating layer. The first conductive pattern 2200 may include a first gate line 2210, a gate electrode 2220, and a second gate line 2230.

The first gate line 2210 may be disposed on the first active pattern 2100 and may extend in the first direction D1. In an embodiment, the first gate line 2210 may form the second transistor T2 together with a part of the first active pattern 2100, for example. For this, the first gate signal GW may be provided to the first gate line 2210.

In an embodiment, the first gate line 2210 may form the seventh transistor T7 together with another part of the first active pattern 2100, for example. For this, the fourth gate signal GB may be provided to the first gate line 2210. In an embodiment, the first gate signal GW and the fourth gate signal GB may have substantially the same waveform with a time difference, for example.

The gate electrode 2220 may form the first transistor T1 together with a part of the first active pattern 2100.

The second gate line 2230 may be disposed on the first active pattern 2100 and may extend in the first direction D1. In an embodiment, the second gate line 2230 may constitute the fifth and sixth transistors T5 and T6 together with a part of the first active pattern 2100, for example. In an embodiment, the second gate line 2230 may be also referred to as an emitting control line, for example.

In an embodiment, the first conductive pattern 2200 may include a metal, an alloy, a conductive metal oxide, a transparent conductive material, and the like, for example. In an embodiment, the first conductive pattern 2200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), and the like, for example.

A first inter-insulating layer (e.g., ILD1 of FIG. 17) may cover the first conductive pattern 2200 and may be disposed on the first gate insulating layer. The first inter-insulating layer may include an insulating material.

The first, second, fifth, sixth and seventh transistors T1, T2, T5, T6 and T7 may be substantially the same as the first, second, fifth, sixth and seventh transistors T1, T2, T5, T6 and T7 described with reference to FIG. 3. In an embodiment, the gate electrode 2220 may correspond to the gate terminal of the first transistor T1 described with reference to FIG. 3, for example. In addition, the gate terminals, first terminals, and second terminals described with reference to FIG. 3 may substantially correspond to conductive patterns to be described later. However, this correspondence relationship will not be described in detail, and the correspondence will be apparent to those skilled in the art to which the invention belongs.

Figure 8:
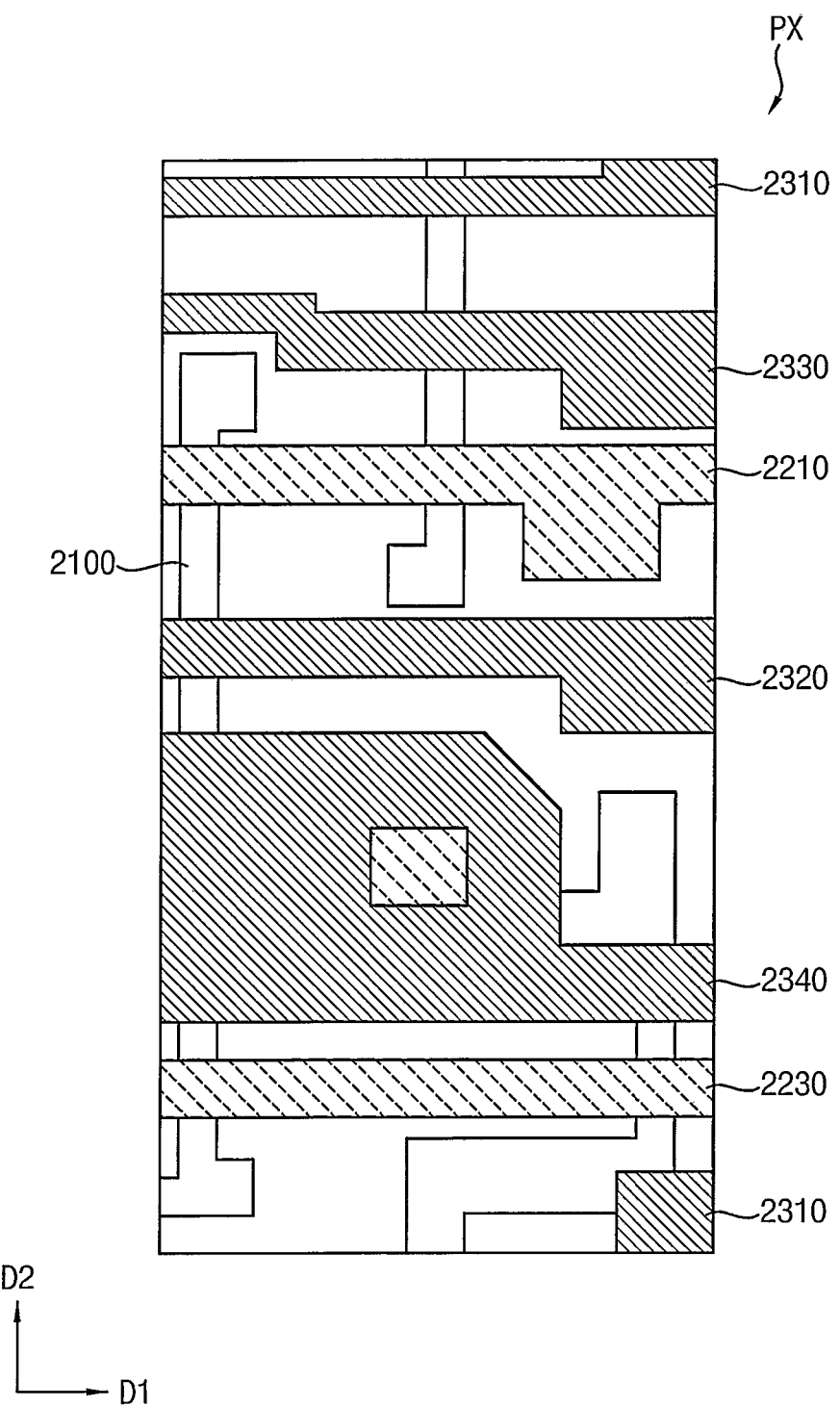

Referring to FIGS. 7 and 8, the second conductive pattern 2300 may be disposed on the first inter-insulating layer. The second conductive pattern 2300 may include a gate initialization voltage line 2310, a third gate line 2320, a fourth gate line 2330, and a storage capacitor electrode 2340.

The gate initialization voltage line 2310 may extend in the first direction D1. In an embodiment, the gate initialization voltage line 2310 may provide the gate initialization voltage VINT to the fourth transistor T4. In an embodiment, the gate initialization voltage line 2310 may provide the gate initialization voltage VINT to a second active pattern (e.g., 2400 of FIG. 9) to be described later, for example.

The third gate line 2320 may extend in the first direction D1. In an embodiment, the third gate line 2320 may provide the second gate signal GC to the third transistor T3. In an embodiment, the third gate line 2320 may contact a first upper electrode (e.g., 2530 of FIG. 12) to be described later, for example.

The fourth gate line 2330 may extend in the first direction D1. In an embodiment, the fourth gate line 2330 may provide the third gate signal GI to the fourth transistor T4. In an embodiment, the fourth gate line 2330 may contact a second upper electrode (e.g., 2540 in FIG. 12) to be described later, for example.

The storage capacitor electrode 2340 may extend in the first direction D1. In an embodiment, the storage capacitor electrode 2340 may form the storage capacitor CST together with the gate electrode 2220. For this, the storage capacitor electrode 2340 may overlap the gate electrode 2220, and the high power voltage ELVDD may be provided to the storage capacitor electrode 2340.

In an embodiment, an opening H exposing an upper surface of the gate electrode 2220 may be defined in the storage capacitor electrode 2340. Through the opening H, the gate electrode 2220 may contact a first connection pattern (e.g., 2520 of FIG. 12) to be described later. In an embodiment, through the opening H, the gate terminal of the first transistor T1 may be electrically connected to the first terminal of the third transistor T3, for example.

In an embodiment, the second conductive pattern 2300 may include a metal, an alloy, a conductive metal oxide, a transparent conductive material, or the like, for example.

A second inter-insulating layer (e.g., ILD2 of FIG. 17) may cover the second conductive pattern 2300 and may be disposed on the first inter-insulating layer. The second inter-insulating layer may include an insulating material.

Figure 9:
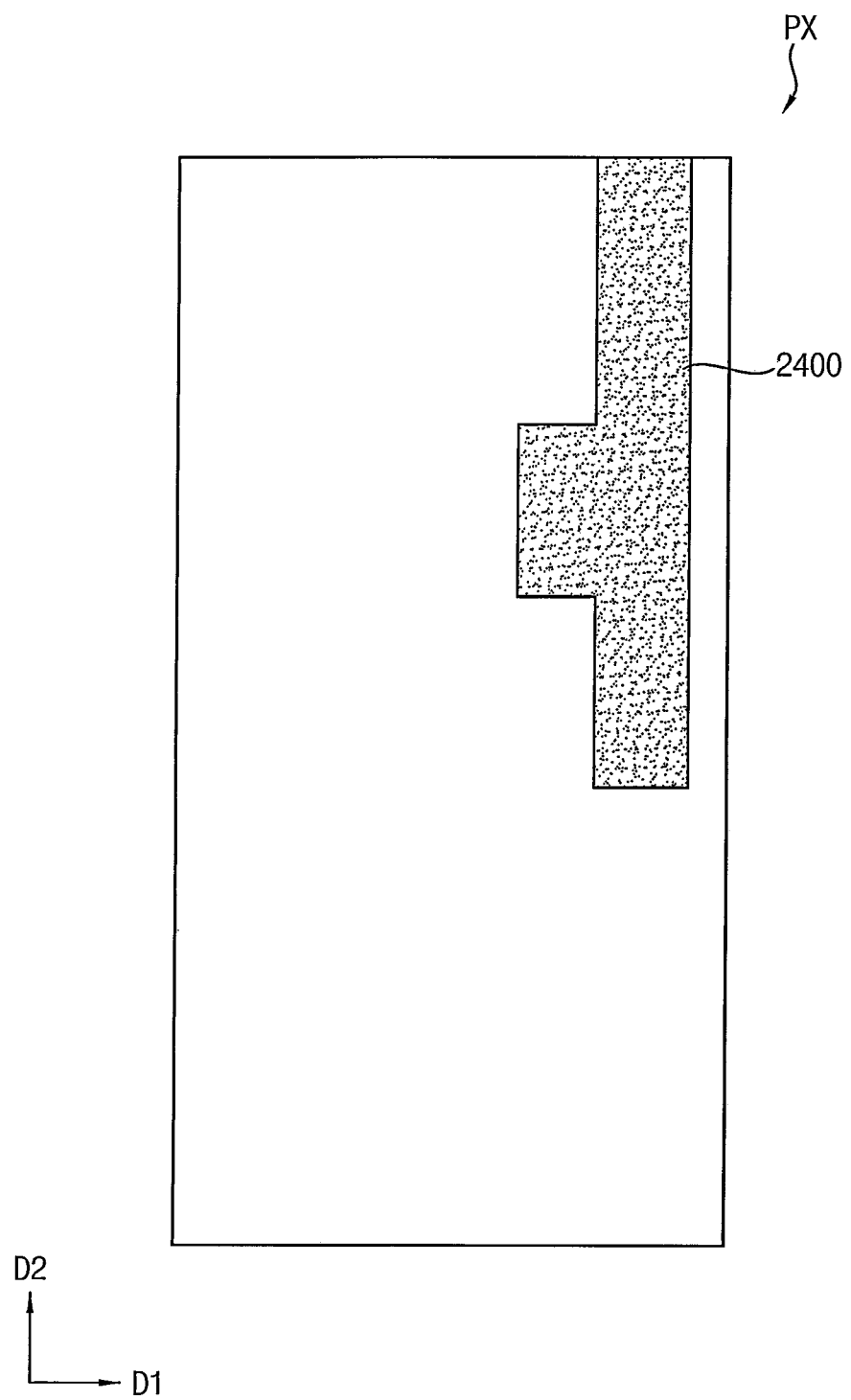
Figure 10:
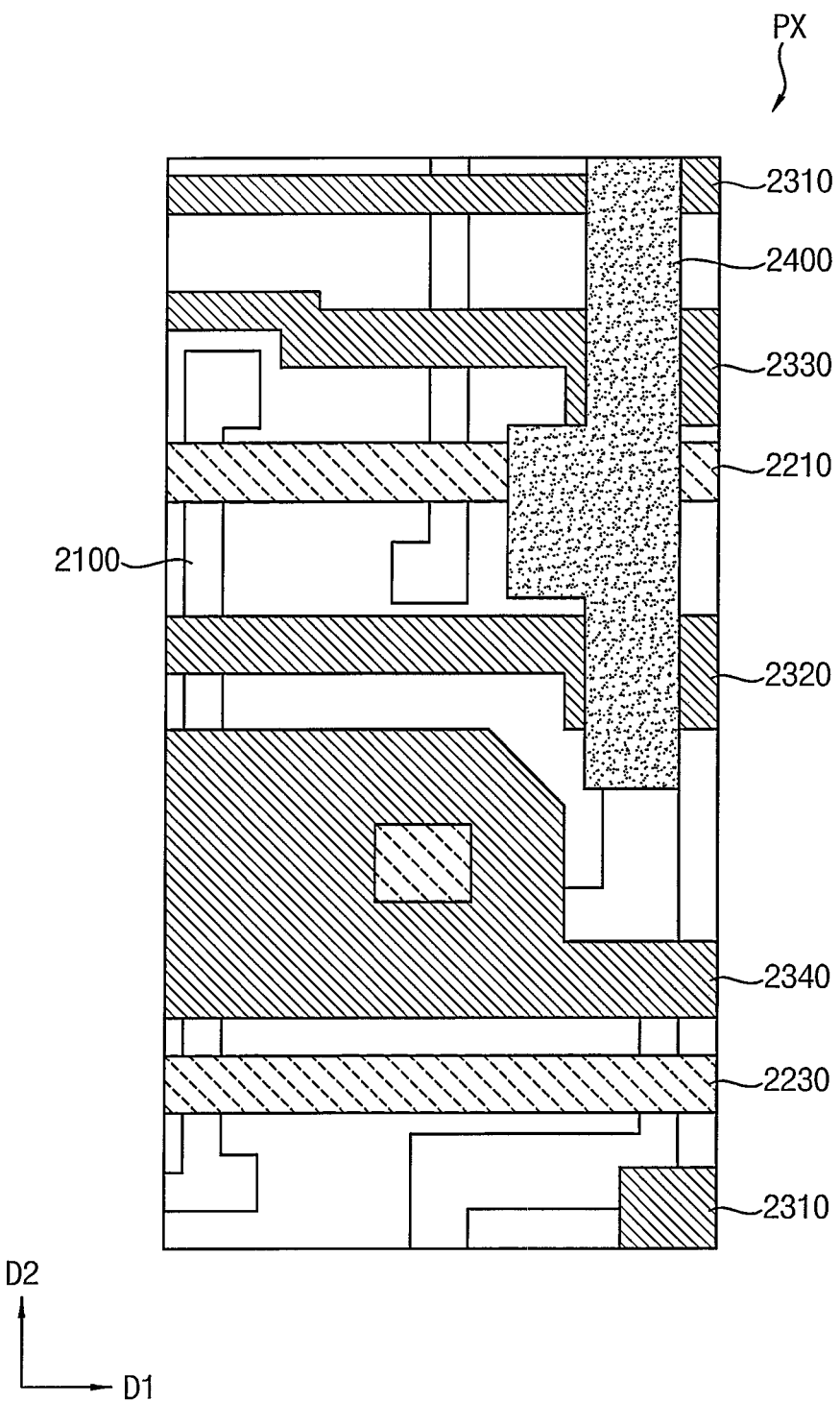

Referring to FIGS. 9 and 10, a second active pattern 2400 may be disposed on the second inter-insulating layer. In an embodiment, the second active pattern 2400 may overlap the third gate line 2320 and the fourth gate line 2330, for example.

In an embodiment, the second active pattern 2400 may be disposed in a different layer from the first active pattern 2100 and may not overlap the first active pattern 2100. In other words, the second active pattern 2400 may be separated from the first active pattern 2100. In an embodiment, the first active pattern 2100 may include the silicon semiconductor, and the second active pattern 2400 may include an oxide semiconductor, for example.

In an embodiment, the pixel structure PX may include the first, second, fifth, sixth, and seventh transistors T1, T2, T5, T6, T7 which are silicon-based semiconductors, and may include the third and fourth transistors T3, T4 which are oxide-based semiconductors. In an embodiment, the first, second, fifth, sixth and seventh transistors T1, T2, T5, T6, T7 may be PMOS transistors, and the third and fourth transistors T3, T4 may be NMOS transistors, for example.

A second gate insulating layer (e.g., GI2 in FIG. 17) may cover the second active pattern 2400 and may be disposed on the second inter-insulating layer. The second gate insulating layer may include an insulating material.

Figure 11:
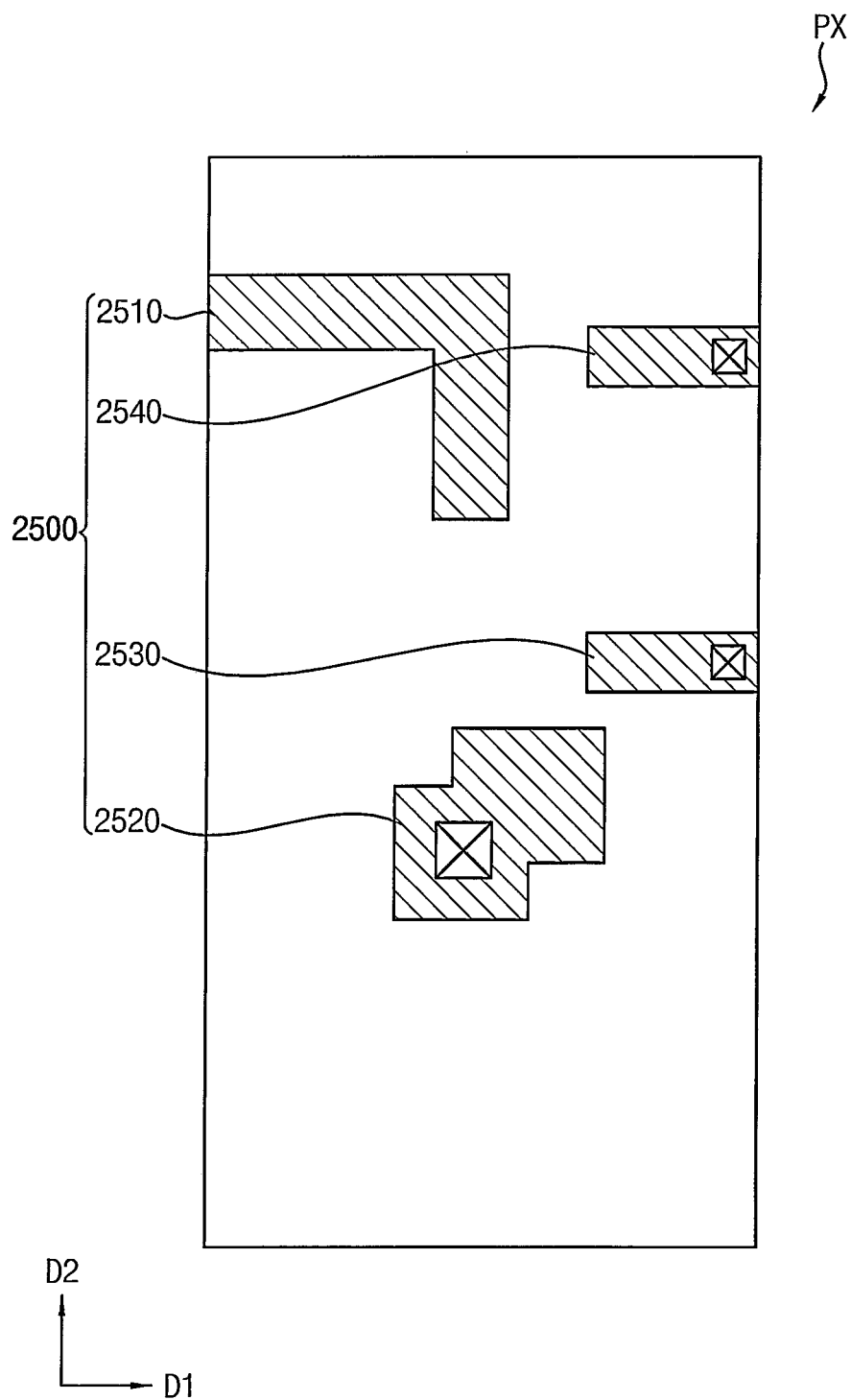
Figure 12:
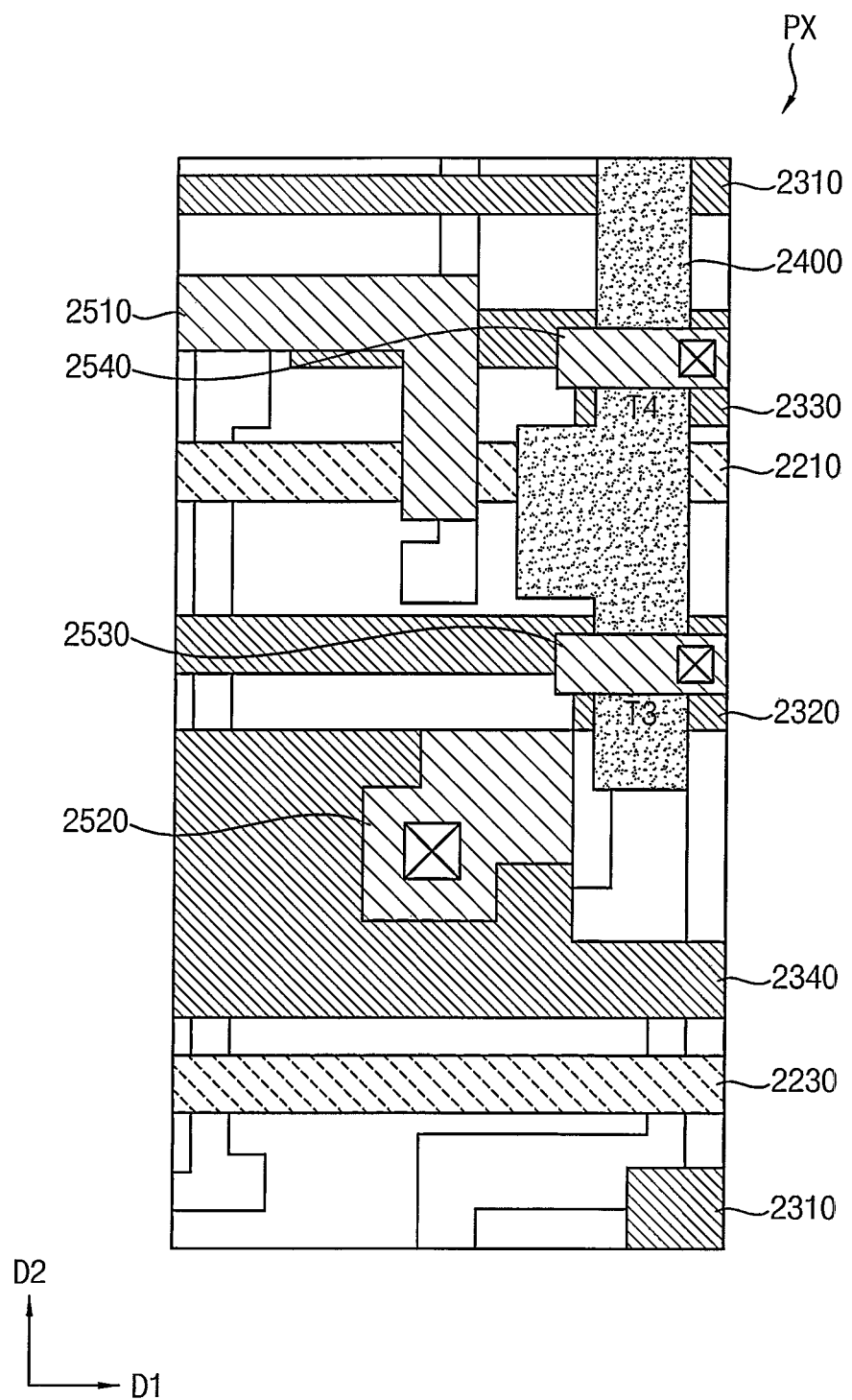

Referring to FIGS. 11 and 12, a third conductive pattern 2500 may be disposed on the second gate insulating layer. The third conductive pattern 2500 may include a third connection pattern 2510, a first connection pattern 2520, a first upper electrode 2530, and a second upper electrode 2540.

In an embodiment, the third connection pattern 2510 may provide the anode initialization voltage AINT to the seventh transistor T7. In an embodiment, the third connection pattern 2510 may provide the anode initialization voltage AINT to a fourth connection pattern (e.g., 2630 of FIG. 13) to be described later, for example. For this, the third connection pattern 2510 may contact the fourth connection pattern.

In an embodiment, the third connection pattern 2510 may overlap the first gate line 2210, the fourth gate line 2330, and a vertical connection line (e.g., 2720 of FIG. 15) to be described later.

In an embodiment, the first connection pattern 2520 may electrically connect the gate terminal of the first transistor T1 and the first terminal of the third transistor T3. For this, the first connection pattern 2520 may contact the gate electrode 2220 and a second connection pattern (e.g., 2660 of FIG. 13) to be described later. In an embodiment, the gate electrode 2220, the opening H of the storage capacitor electrode 2340, and the first connection pattern 2520 may overlap each other, for example. In other words, the first connection pattern 2520 may overlap the contact hole. The contact hole may overlap the opening H of the storage capacitor electrode 2340. The first connection pattern 2520 may contact the gate electrode 2220 through the contact hole.

In an embodiment, the first upper electrode 2530 may provide the second gate signal GC to the third transistor T3. For this, the first upper electrode 2530 may contact the third gate line 2320. In an embodiment, the first upper electrode 2530 may overlap the third gate line 2320 and the second active pattern 2400, for example.

In an embodiment, the second upper electrode 2540 may provide the third gate signal GI to the fourth transistor T4. For this, the second upper electrode 2540 may contact the fourth gate line 2330. In an embodiment, the second upper electrode 2540 may overlap the fourth gate line 2330 and the second active pattern 2400, for example.

A third inter-insulating layer (e.g., ILD3 in FIG. 17) may cover the third conductive pattern 2500 and may be disposed on the second gate insulating layer. The third inter-insulating layer may include an insulating material.

Figure 13:
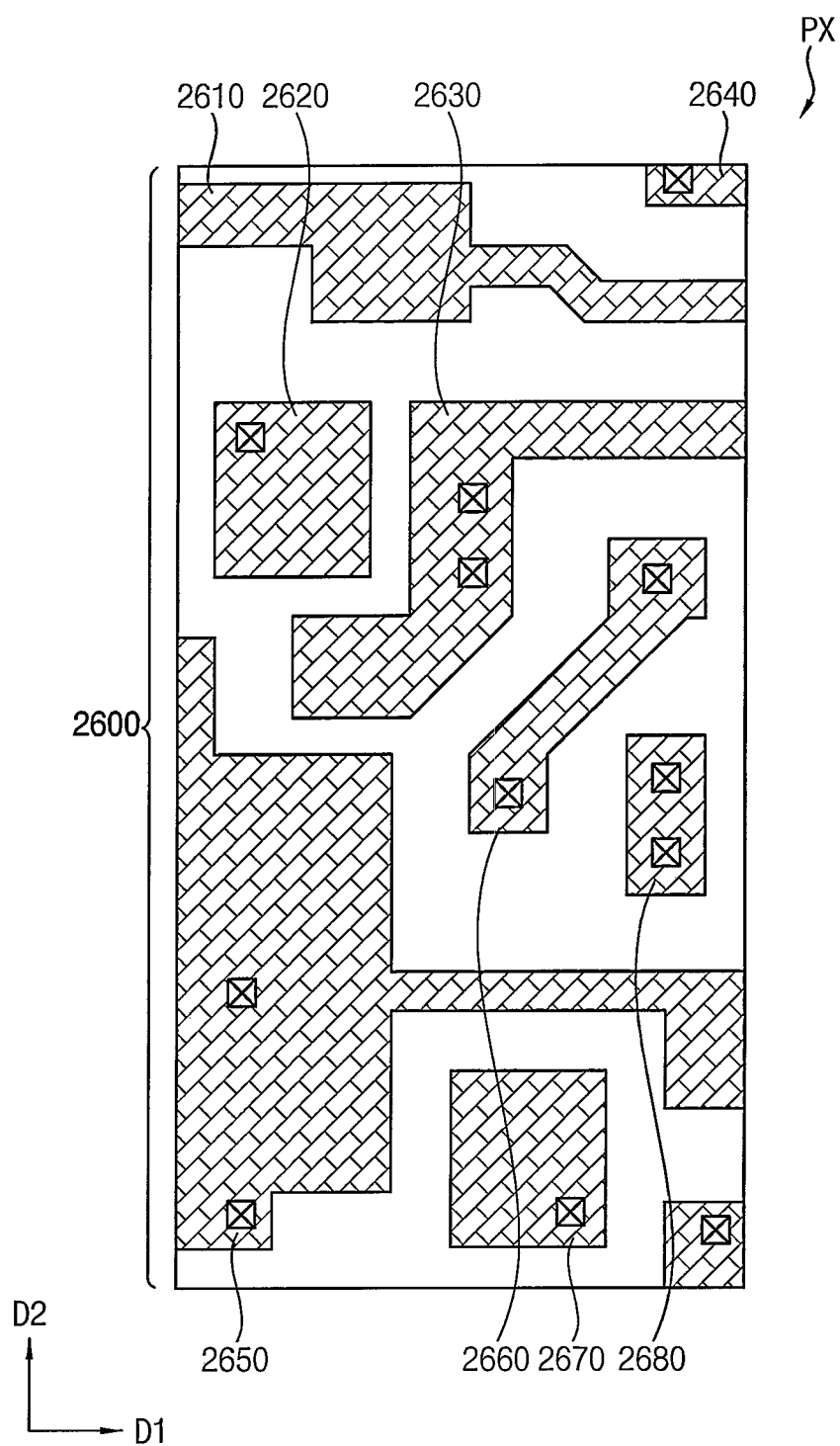
Figure 14:
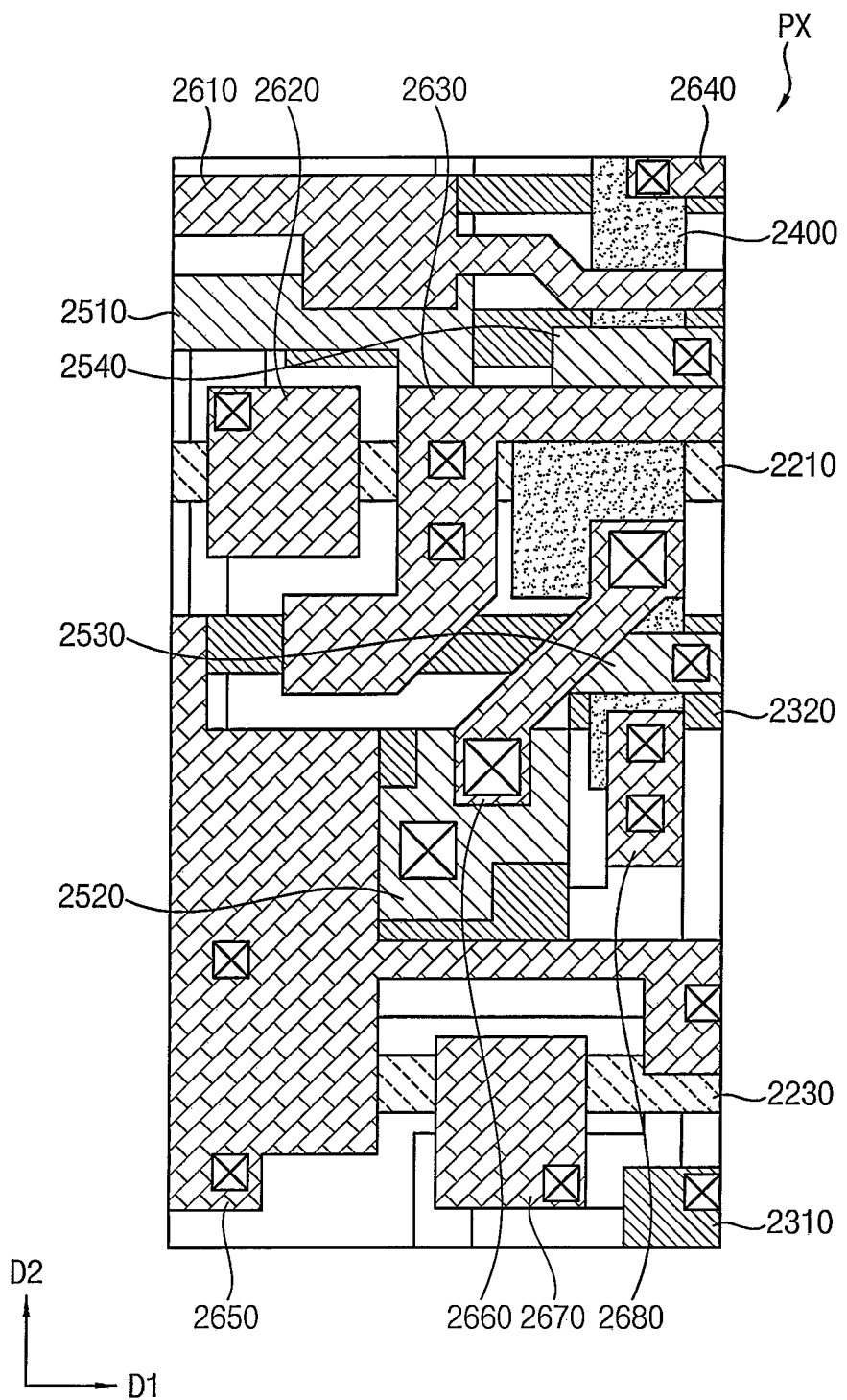

Referring to FIGS. 13 and 14, the fourth conductive pattern 2600 may be disposed on the third inter-insulating layer. The fourth conductive pattern 2600 may include a horizontal connection line 2610, a data voltage pad 2620, a fourth connection pattern 2630, a gate initialization voltage connection pattern 2640, a shielding pattern 2650, a second connection pattern 2660, a first pad 2670, and a compensation connection pattern 2680.

The horizontal connection line 2610 may extend in the first direction D1. In an embodiment, the horizontal connection line 2610 may provide the data voltage DATA to the second transistor T2. For this, the horizontal connection line 2610 may contact a vertical connection line 2720 and a data line 2710 to be described later. In an embodiment, the horizontal connection line 2610 may correspond to the first horizontal connection line HFL1 or the second horizontal connection line HFL2 of FIG. 2, for example.

In an embodiment, the horizontal connection line 2610 may overlap the third connection pattern 2510. Accordingly, the area on the plane of the pixel structure PX may be reduced. In addition, the third connection pattern 2510 may overlap the fourth gate line 2330 and the horizontal connection line 2610. Accordingly, the third connection pattern 2510 may prevent a crosstalk phenomenon that may occur between the fourth gate line 2330 and the horizontal connection line 2610.

The data voltage pad 2620 may provide the data voltage DATA to the first active pattern 2100. For this, the data voltage pad 2620 may contact the first active pattern 2100 and a data line to be described later. In an embodiment, the data voltage pad 2620 may overlap the first active pattern 2100 and the data line, for example.

In an embodiment, the fourth connection pattern 2630 may provide the anode initialization voltage AINT to the seventh transistor T7. In an embodiment, the fourth connection pattern 2630 may provide the anode initialization voltage AINT to the first active pattern 2100, for example. For this, the fourth connection pattern 2630 may contact the first active pattern 2100.

In an embodiment, the fourth connection pattern 2630 may overlap the first gate line 2210, the second gate line 2230, and a vertical connection line (e.g., 2720 of FIG. 15) to be described later.

The gate initialization voltage connection pattern 2640 may provide the gate initialization voltage VINT to the fourth transistor T4. In an embodiment, the gate initialization voltage connection pattern 2640 may provide the gate initialization voltage VINT to the second active pattern 2400, for example. For this, the gate initialization voltage connection pattern 2640 may contact the gate initialization voltage line 2310 and the second active pattern 2400.

The shielding pattern 2650 may provide the high power voltage ELVDD to the first active pattern 2100. In an embodiment, the shielding pattern 2650 may electrically connect the high power voltage line (e.g., 2740 of FIG. 15) to be described later with the first active pattern 2100. In an embodiment, the shielding pattern 2650 may extend in the first direction D1 and may contact the high power voltage line and the first active pattern 2100, for example. For this, the shielding pattern 2650 may overlap the high power voltage line and the first active pattern 2100.

In an embodiment, the shielding pattern 2650 may overlap the vertical connection line and the second gate line 2230. Accordingly, the shielding pattern 2650 may prevent a crosstalk phenomenon that may occur between the vertical connection line and the second gate line 2230.

In an embodiment, the shielding pattern 2650 may be disposed between the vertical connection line and the first connection pattern 2520. Accordingly, the shielding pattern 2650 may prevent a crosstalk phenomenon that may occur between the vertical connection line and the first connection pattern 2520.

In an embodiment, the second connection pattern 2660 may electrically connect the gate terminal of the first transistor T1 and the first terminal of the third transistor T3. To this end, the second connection pattern 2660 may contact the second active pattern 2440 and the first connection pattern 2520. In an embodiment, the second connection pattern 2660 may overlap the second active pattern 2400 and the first connection pattern 2520, for example.

The first pad 2670 may provide the anode initialization voltage AINT to a first electrode (e.g., 2810 of FIG. 17) of the organic light emitting device OLED to be described later.

The compensation connection pattern 2680 may electrically connect the second active pattern 2400 and the first active pattern 2100. In an embodiment, the second terminal (e.g., the drain terminal of the third transistor) of the third transistor T3 may be connected the second terminal (e.g., the drain terminal of the first transistor) of the first transistor T1 through the compensation connection pattern 2680, for example.

A first via insulating layer (e.g., VIA1 in FIG. 17) may cover the fourth conductive pattern 2600 and may be disposed on the third inter-insulating layer. The first via insulating layer may include an organic insulating material. In an embodiment, the first via insulating layer may include a photoresist, a polyacrylic resin, a polyimide resin, an acrylic resin, or the like, for example.

Referring to FIGS. 15 and 16, the fifth conductive pattern 2700 may be disposed on the first via insulating layer. The fifth conductive pattern 2700 may include a data line 2710, a vertical connection line 2720, a second pad 2730, and a high power voltage line 2740.

The data line 2710 may extend in the second direction D2. In an embodiment, the data line 2710 may provide the data voltage DATA to the second transistor T2. For this, the data line 2710 may contact the data voltage pad 2620.

In an embodiment, the data line 2710 may provide the data voltage DATA from the data driver DDV to the data voltage pad 2620. In this case, the data line 2710 may correspond to the third data line DL3 or the fourth data line DL4 of FIG. 2. In another embodiment, the data line 2710 may provide the data voltage DATA from the horizontal connection line to the data voltage pad 2620. In this case, the data line 2710 may correspond to the first data line DL1 or the second data line DL2 of FIG. 2.

The vertical connection line 2720 may extend in the second direction D2. In an embodiment, the vertical connection line 2720 may provide the data voltage DATA to the second transistor T2. For this, the vertical connection line 2720 may contact the horizontal connection line 2610. In an embodiment, the vertical connection line 2720 may correspond to the first vertical connection line VFL1 or the second vertical connection line VFL2 of FIG. 2, for example.

In an embodiment, the fourth gate line 2330, the third connection pattern 2510, and the vertical connection line 2720 may overlap each other. In addition, the first gate line 2210, the third connection pattern 2510, the fourth connection pattern 2630, and the vertical connection line 2720 may overlap each other. In addition, the third gate line 2320, the fourth connection pattern 2630, and the vertical connection line 2720 may overlap each other.

In an embodiment, the second gate line 2230, the shielding pattern 2650, and the vertical connection line 2720 may overlap each other.

The high power voltage line 2740 may extend in the second direction D2. In an embodiment, the high power voltage line 2740 may provide the high power voltage ELVDD to the shielding pattern 2650. For this, the high power voltage line 2740 may contact the shielding pattern 2650.

In an embodiment, the high power voltage line 2740 may overlap the second active pattern 2400. In an embodiment, the second active pattern 2400 may include an oxide semiconductor, for example. When the oxide semiconductor is exposed to light, a leakage current may be generated through the third and fourth transistors T3 and T4 including the oxide semiconductor. The light may be external light or light generated by the organic light emitting diode OLED, for example. Since the high power voltage line 2740 overlaps the second active pattern 2400, the second active pattern 2400 may not be exposed to the light.

Figure 17:
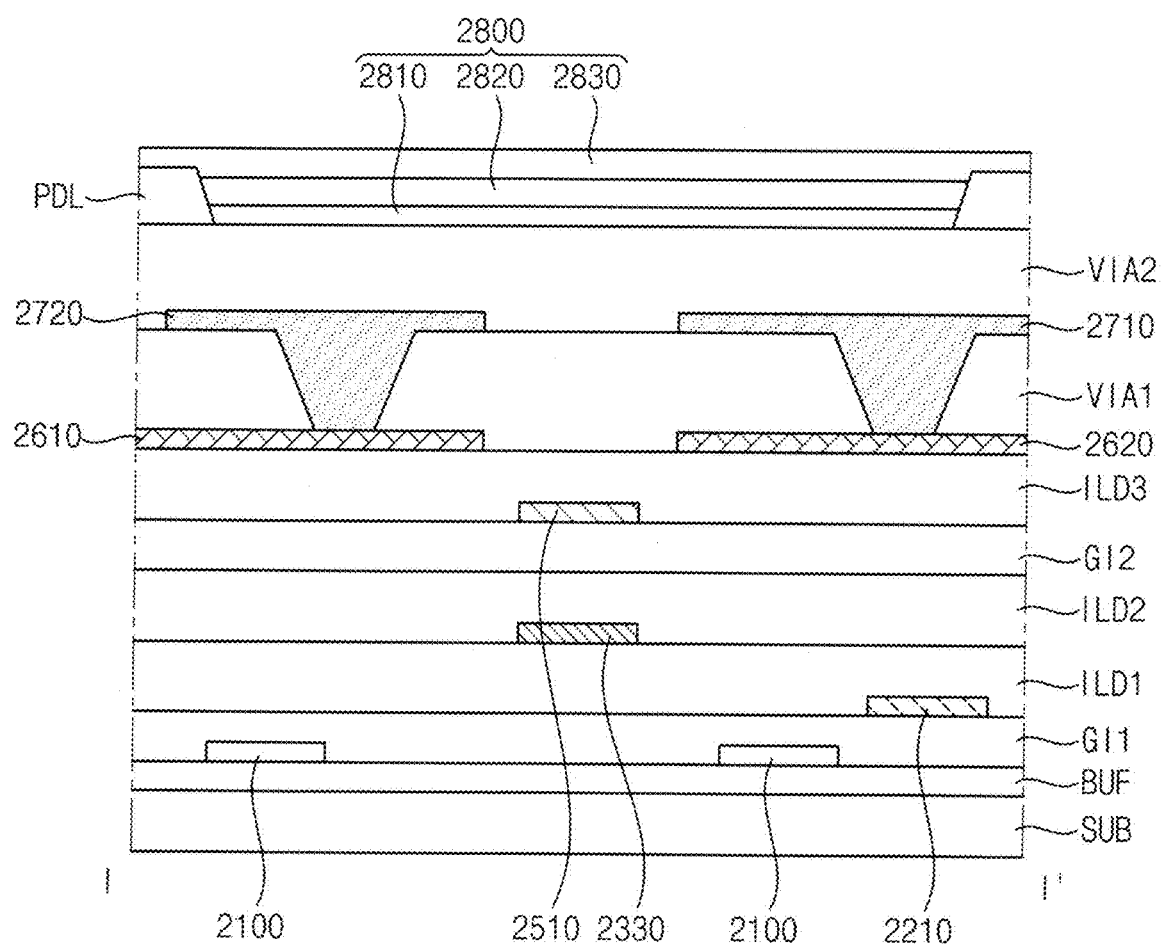
FIG. 17 is a cross-sectional view taken along line I-I' of FIG. 16.

FIG. 17 is a cross-sectional view taken along line I-I' of FIG. 16.

Referring to FIGS. 4 to 17, the pixel structure PX illustrated in FIG. 17 may have a structure in which the above-described the substrate SUB, a buffer layer BUF, the first active pattern 2100, the first gate insulating layer GI1, the first gate line 2210, the first inter-insulating layer ILD1, the fourth gate line 2330, the second inter-insulating layer ILD2, the second gate insulating layer GI2, the third connection pattern 2510, the third inter-insulating layer ILD3, the horizontal connection pattern 2610, the data voltage pad 2620, a first via insulating layer VIA1, the data line 2710, the vertical connection line 2720, a second via insulating layer VIA2, a pixel defining layer PDL, a first electrode 2810, a emitting layer 2820, and a second electrode 2830 are sequentially disposed. The first electrode 2810, the emitting layer 2820, and the second electrode 2830 may constitute an organic light emitting structure 2800. In an embodiment, the organic light emitting structure 2800 may correspond to the organic light emitting diode OLED described above, for example.

In an embodiment, the horizontal connection pattern 2610 may overlap the vertical connection line 2720. The horizontal connection pattern 2610 may be electrically connected to the vertical connection line 2720. The horizontal connection pattern 2610 may be electrically connected to the vertical connection line 2720 by a contact hole defined by etching a first portion of the first via insulating layer VIA1. In addition, in an embodiment, the data voltage pad 2620 may overlap the data line 2710. The data voltage pad 2620 may be electrically connected to the data line 2710. The data voltage pad 2620 may be electrically connected to the data line 2710 by a contact hole defined by etching a second portion of the first via insulating layer VIA1.

The fourth conductive pattern 2600 and the fifth conductive pattern 2700 may be electrically connected to each other through the contact holes. A signal such as the data voltage DATA may flow in the first direction D1 and the second direction D2. Through this, the fourth conductive pattern 2600 and the fifth conductive pattern 2700 may replace conventional fan-out wires. As a result, the non-display area (e.g., dead space, bezel area, etc.) of the display device may be reduced.

Figure 18:
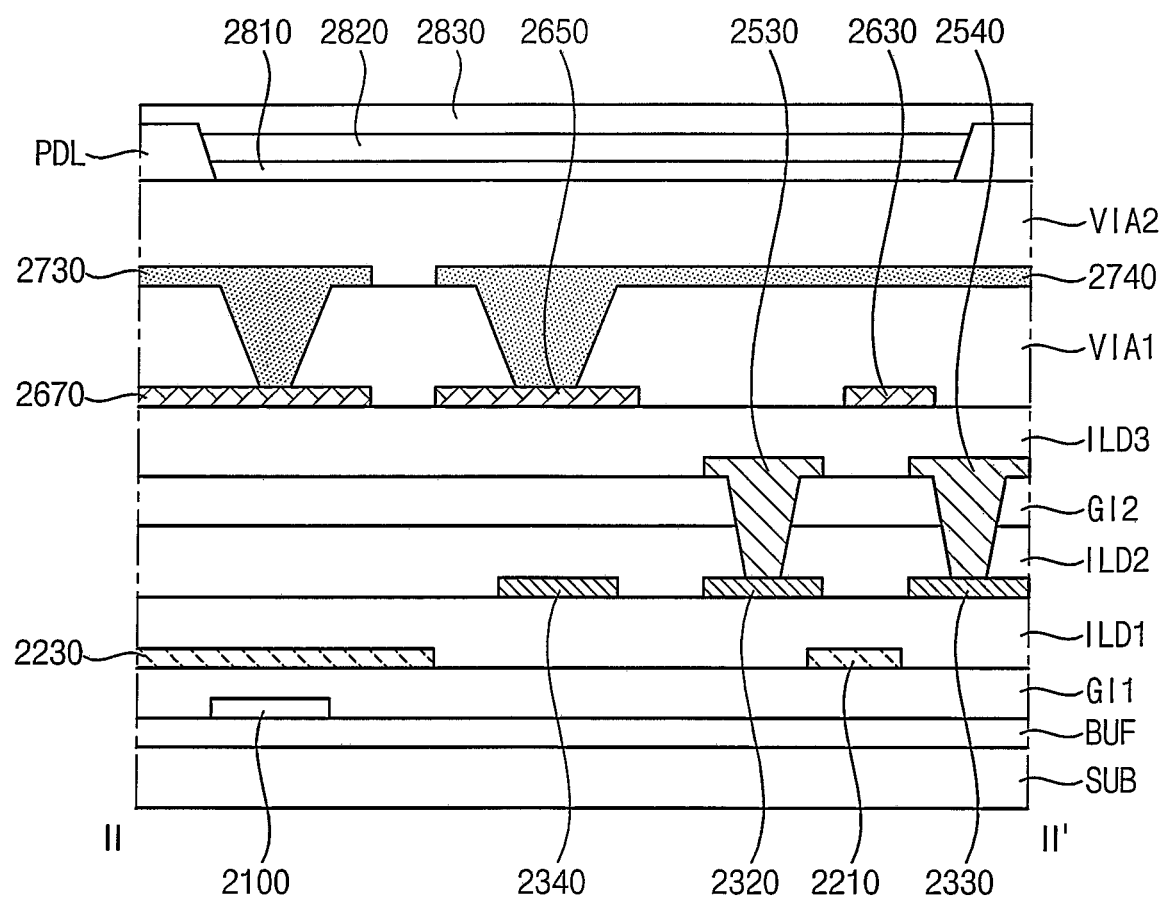
FIG. 18 is a cross-sectional view taken along line II-IF of FIG. 16.

FIG. 18 is a cross-sectional view taken along line II-II' of FIG. 16.

Referring to FIGS. 4 to 18, The pixel structure PX illustrated in FIG. 18 may have a structure in which the above-described the substrate SUB, the buffer layer BUF, the first active pattern 2100, the first gate insulating layer GI1, the first gate line 2210, the second gate line 2230, the first inter-insulating layer ILD1, the third gate line 2320, the fourth gate line 2330, the storage capacitor electrode 2340, the second inter-insulating layer ILD2, the second gate insulating layer GI2, the first upper electrode 2530, the second upper electrode 2540, the third inter-insulating layer ILD3, the first pad 2670, the fourth connection pattern 2630, the shielding pattern 2650, the first via insulating layer VIA1, the second pad 2730, the high power voltage line 2740, the second via insulating layer VIA2, the pixel defining layer PDL, the first electrode 2810, the light emitting layer 2820, and the second electrode 2830 are sequentially disposed In an embodiment, the third gate line 2320 and the first upper electrode 2530 may overlap. The third gate line 2320 and the first upper electrode 2530 may be electrically connected. The third gate line 2320 and the first upper electrode 2530 may be electrically connected through a contact hole defined by etching a first portion of the second inter-insulating layer ILD2 and the second gate insulating layer GI2. Also, in an embodiment, the fourth gate line 2330 and the second upper electrode 2540 may overlap. The fourth gate line 2330 and the second upper electrode 2540 may be electrically connected. The fourth gate line 2330 and the second upper electrode 2540 are electrically connected through a contact hole defined by etching a second portion of the second inter-insulating layer ILD2 and the second gate insulating layer GI2.

In an embodiment, the first pad 2670 and the second pad 2730 may overlap. The first pad 2670 and the second pad 2730 may be electrically connected. The first pad 2670 and the second pad 2730 may be electrically connected through a contact hole defined by etching a third portion of the first via insulating layer VIA1. In addition, in an embodiment, the shielding pattern 2650 and the high power voltage line 2740 may overlap. The shielding pattern 2650 and the high power voltage line 2740 may be electrically connected. The shielding pattern 2650 and the high power voltage line 2740 may be electrically connected through a contact hole defined by etching a fourth portion of the first via insulating layer VIA1.

In this way, as the third gate line 2320 and the first upper electrode 2530 are electrically connected, and the fourth gate line 2330 and the second upper electrode 2540 are electrically connected, the gate signals may flow through the second conductive pattern 2300 and the third conductive pattern 2500. Through this, a space for arranging the third connection pattern 2510 and the first connection pattern 2520 may be secured. In addition, as the space is secured, a plurality of lines, patterns, and pads extending in the first direction D1 and the second direction D2 may be disposed in the fourth conductive pattern 2600 and the fifth conductive pattern 2700. As a result, the non-display area (e.g., dead space, bezel area, etc.) of the display device may be reduced.

Embodiments of the invention may be applied to a display device and an electronic device including the display device. In an embodiment, the invention may be applied to a smart phone, a cellular phone, a video phone, a smart pad, a smart watch, a tablet personal computer ("PC"), a car navigation system, a television, a computer monitor, a laptop, a head mounted display apparatus, MP3 player, etc., for example.

The foregoing is illustrative of embodiments and is not to be construed as limiting thereof. Although embodiments have been described, those skilled in the art will readily appreciate that many modifications are possible in embodiments without materially departing from the novel teachings and advantages of the invention. Accordingly, all such modifications are intended to be included within the scope of the invention as defined in the claims. Therefore, it is to be understood that the foregoing is illustrative of embodiments and is not to be construed as limited to the embodiments disclosed.

What is claimed is:

1. A display device comprising:
a first active pattern including a silicon semiconductor;
a first conductive pattern including:
   a gate electrode of a driving transistor overlapping the first active pattern;
   a first gate electrode overlapping the first active pattern and extending in a first direction; and
   a second gate electrode extending in the first direction;
a second conductive pattern disposed on the first conductive pattern and including:
   a third gate electrode of a compensation transistor extending in the first direction; and
   a fourth gate electrode of an initialization transistor extending in the first direction;
a second active pattern disposed on the second conductive pattern, including an oxide semiconductor, and extending in a second direction perpendicular to the first direction;
a third conductive pattern disposed on the second active pattern and including:
   a first upper electrode of the compensation transistor overlapping the third gate electrode and electrically connected to the third gate electrode; and
   a second upper electrode of the initialization transistor overlapping the fourth gate electrode and electrically connected to the fourth gate electrode; and
a fourth conductive pattern disposed on the third conductive pattern and including:
a connection pattern electrically connecting the gate electrode of the driving transistor and the second active pattern and extending in a third direction crossing both the first direction and the second direction.

2. The display device of claim 1, further comprising:
a fifth conductive pattern disposed on the fourth conductive pattern and including a high power voltage line,
wherein the high power voltage line overlaps at least a portion of the connection pattern, and
wherein the high power voltage line overlaps at least a portion of the second active pattern.

3. The display device of claim 2, wherein the fourth conductive pattern further includes a horizontal connection line extending in the first direction and applied with a first data voltage.

4. The display device of claim 3, wherein the fifth conductive pattern further includes:
a data line extending in the second direction and applied with a second data voltage; and
a vertical connection line extending in the second direction and applied with the first data voltage.

5. The display device of claim 4, wherein the fourth conductive pattern further includes a data voltage pad, and
wherein the data line overlaps the data voltage pad and is electrically connected to the data voltage pad.

6. The display device of claim 4, wherein the vertical connection line overlaps the horizontal connection line and is electrically connected to the horizontal connection line.

7. The display device of claim 4, wherein the fourth conductive pattern further includes a shielding pattern, and
wherein the high power voltage line overlaps the shielding pattern.

8. The display device of claim 7, wherein the high power voltage line is electrically connected to the shielding pattern.

9. The display device of claim 2, wherein the first upper electrode and the second upper electrode overlap a first channel and a second channel of the second active pattern, respectively, and
wherein the high power voltage line overlaps the first and second channels of the second active pattern.

10. The display device of claim 2, further comprising:
a first via insulating layer disposed between the fourth conductive pattern and the fifth conductive pattern and including an organic insulating material.

11. The display device of claim 2, wherein the high power voltage line extends in the second direction.

12. The display device of claim 2, wherein the high power voltage line is applied with a high power voltage.

13. The display device of claim 1, wherein an angle formed by the first direction and the third direction is greater than 0° and less than 90°.

14. The display device of claim 1, wherein a first gate signal is applied to the first gate electrode, a second gate signal is applied to the third gate electrode, and a third gate signal is applied to the fourth gate electrode.

15. The display device of claim 1, wherein a light emitting control signal is applied to the second gate electrode.

16. The display device of claim 1, wherein the second conductive pattern further includes a gate initialization voltage line.

17. The display device of claim 16,
wherein the fourth conductive pattern further includes a gate initialization voltage connection pattern, and
wherein the gate initialization voltage connection pattern overlaps the gate initialization voltage line and is electrically connected to the gate initialization voltage line.

18. The display device of claim 17, wherein the gate initialization voltage connection pattern overlaps the second active pattern and is electrically connected to the second active pattern.

19. The display device of claim 1, wherein a portion of the first gate electrode and a portion of the first active pattern, which overlap each other, constitute a p-channel transistor,
wherein a portion of the second gate electrode and a portion of the first active pattern, which overlap each other, constitute a p-channel transistor, and
wherein the driving transistor is a p-channel transistor.

20. The display device of claim 1, wherein the compensation transistor is an n-channel transistor, and
wherein the initialization transistor is an n-channel transistor.

* * * * *